United States Patent
Onodera et al.

(10) Patent No.: US 7,579,634 B2
(45) Date of Patent: Aug. 25, 2009

(54) SEMICONDUCTOR DEVICE INCLUDING A FIELD EFFECT TRANSISTOR

(75) Inventors: Koji Onodera, Kanagawa (JP); Mitsuhiro Nakamura, Kanagawa (JP); Tomoya Nishida, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/331,292

(22) Filed: Jan. 12, 2006

(65) Prior Publication Data

US 2006/0157734 A1    Jul. 20, 2006

(30) Foreign Application Priority Data

Jan. 17, 2005    (JP) .......................... P2005-008551

(51) Int. Cl.
    *H01L 29/20*    (2006.01)
(52) U.S. Cl. ............................ 257/192; 257/E21.371
(58) Field of Classification Search ................. 257/192, 257/194, 499, 504, 509, 544, E21.371
    See application file for complete search history.

(56) References Cited

U.S. PATENT DOCUMENTS

| | | | |
|---|---|---|---|
| 5,068,705 A | * | 11/1991 | Tran ........................... 257/273 |
| 5,072,274 A | * | 12/1991 | Kokado ....................... 257/565 |
| 5,243,206 A | * | 9/1993 | Zhu et al. .................... 257/192 |
| 5,243,207 A | * | 9/1993 | Plumton et al. .............. 257/192 |
| 5,378,920 A | * | 1/1995 | Nakagawa et al. ........... 257/487 |
| 5,852,327 A | * | 12/1998 | Komori et al. ............... 257/748 |
| 5,869,856 A | * | 2/1999 | Kasahara .................... 257/287 |
| 5,914,758 A | * | 6/1999 | Kishida et al. ............... 349/51 |
| 5,929,437 A | * | 7/1999 | Elliott et al. ................. 250/259 |
| 6,476,431 B1 | * | 11/2002 | Ohno et al. .................. 257/280 |
| 2004/0104404 A1 | * | 6/2004 | Bito ............................ 257/192 |

FOREIGN PATENT DOCUMENTS

JP    2001110817    4/2001

OTHER PUBLICATIONS

Sze, S.M., Physics of Semiconductor Devices: Second Edition, John Wiley & Sons, 1981, p. 306.*
Suemitsu et al, Kink modification using body contact bias in InP based InAlAs/InGaAs HEMTs, Electronic Letters, Jun. 6, 1996, vol. 32, No. 12, pp. 1143-1144.*
Suemitsu et al, Body Contacts in InP-based InAlAs/InGaAs HEMTs and their effects on breakdown voltage and kink suppression, Electronic Letters, Apr. 27, 1995, vol. 31, No. 9, pp. 758-759.*
Sleiman et al, Breakdown Quenching in High Electron Mobility Transistor by Using Body Contact, IEEE Transactions on Electron Devices, vol. 48, No. 10, Oct. 10, 2001, pp. 2188-2191.*

* cited by examiner

*Primary Examiner*—Jerome Jackson, Jr.
*Assistant Examiner*—Anthony Ho
(74) *Attorney, Agent, or Firm*—K&L Gates LLP

(57) ABSTRACT

A semiconductor device is provided. The semiconductor device in which a field effect transistor utilizing a heterojunction is formed in a device formation region sectioned by a device separation region of a substrate comprising a semiconductor layer laminated while including a semiconductor layer having a heterojunction on a semiconductor substrate. The device separation region is composed of a layer in which a conductive impurity is introduced, and an electrode to which a positive voltage is to be applied is formed on the device separation region, specifically on the surface of at least a part of the device separation region in the periphery of the field effect transistor.

14 Claims, 15 Drawing Sheets

PRIOR ART  FIG.5
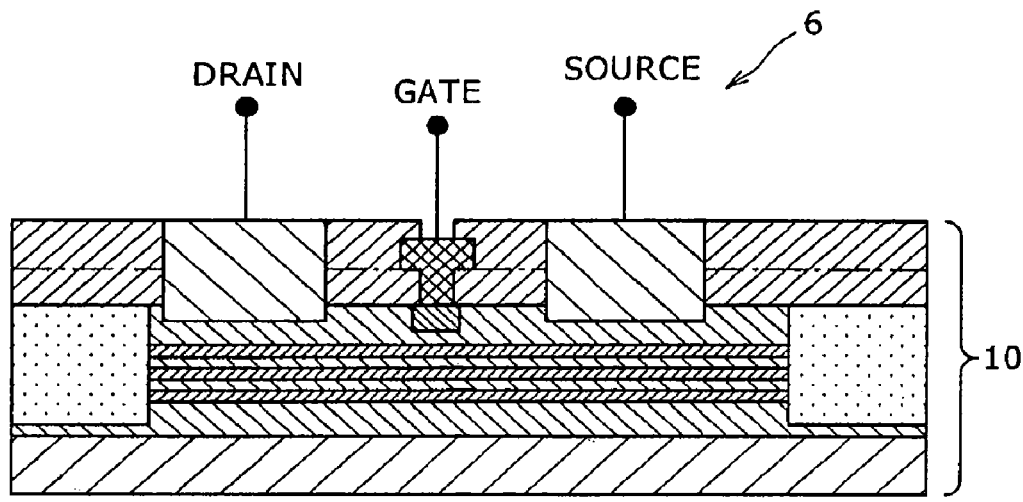
FIG.6
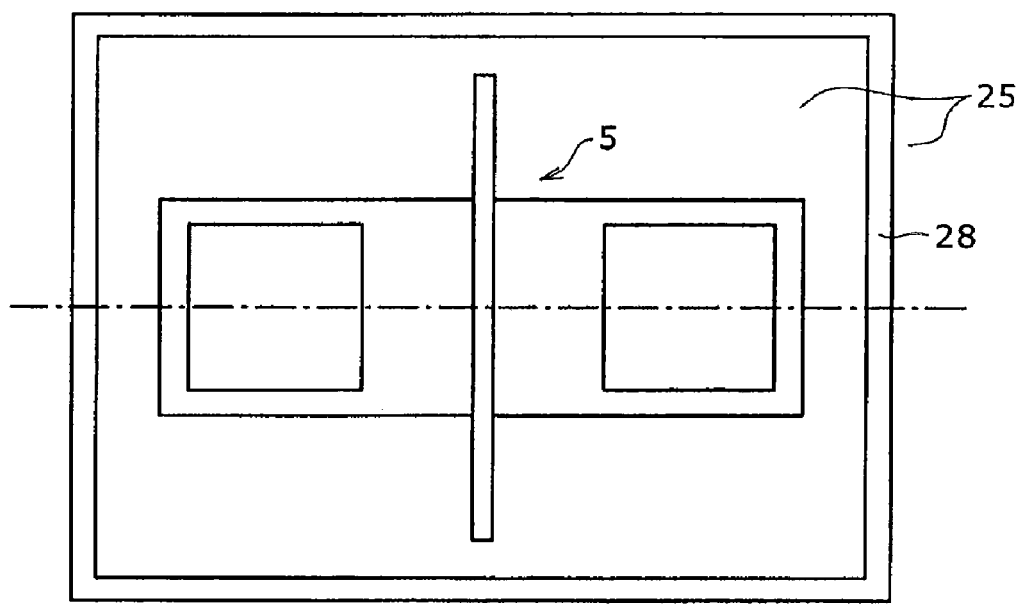

FIG.8A  FIG.8B
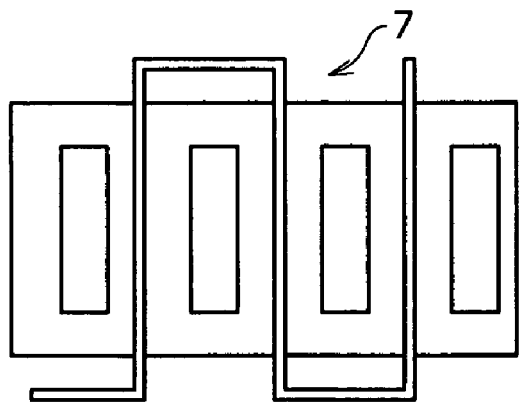
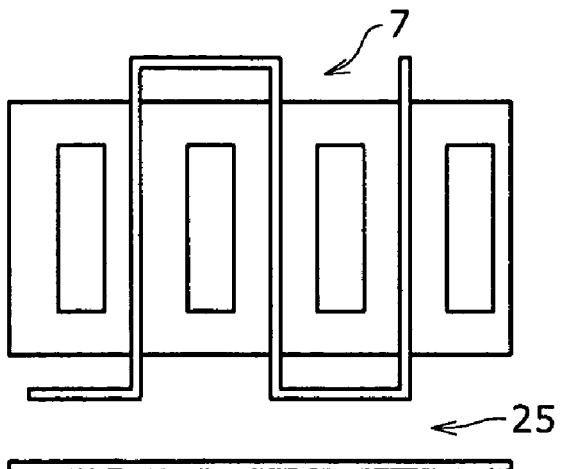
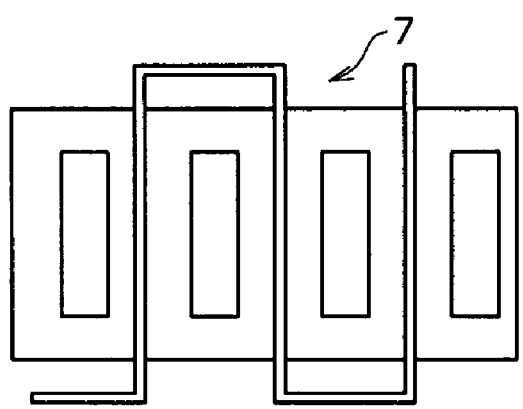
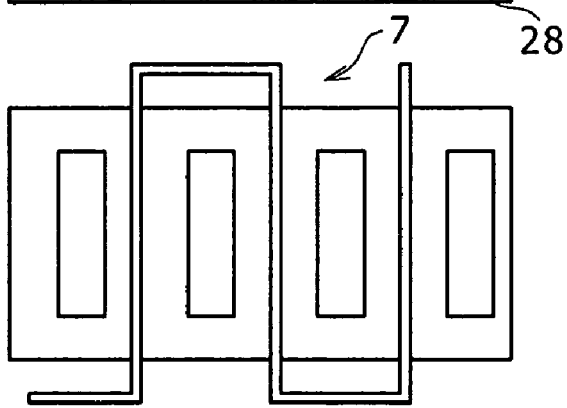
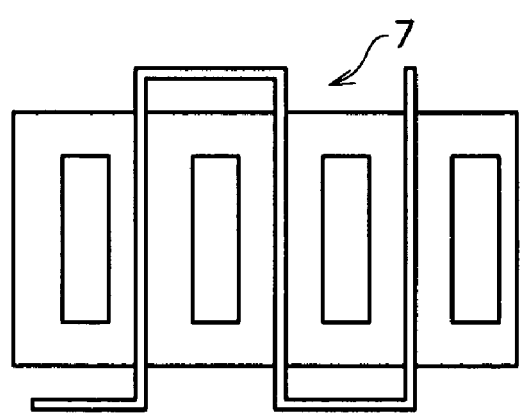
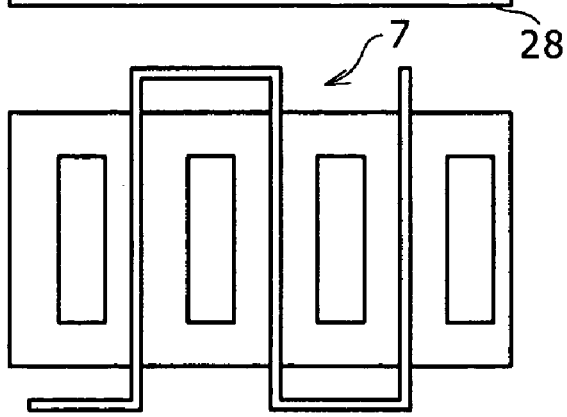

11 12 13 14 15 16 17 18 19

SEMICONDUCTOR DEVICE INCLUDING A FIELD EFFECT TRANSISTOR

CROSS REFERENCES TO RELATED APPLICATIONS

The present application claims priority to Japanese Patent Application JP 2005-008551 filed with the Japanese Patent Office on Jan. 17, 2005, the entire contents of which being incorporated herein by reference.

BACKGROUND

The present invention generally relates to a semiconductor device and a method of manufacturing a semiconductor device by which the performance of a heterojunction field effect transistor can be enhanced easily.

In recent years, the progress of technology in the information and communication field has been remarkable. As for the frequency bands dealt with in communication apparatuses, in communication circuits for processing high-frequency signals from the microwave band to the millimeter wave band, ON/OFF type switches for passing signals therethrough as well as route changeover type switches for controlling transmission lines by a combination of a plurality of the ON/OFF type switches and the like are used in many cases. The ON/OFF type switches constituting the basis are generally composed of mechanical switches for performing mechanical opening and closing actions, PN diode switches using the PN junction of a semiconductor, FET switches using the switching function of an FET (Field Effect Transistor), and the like (see, for example, Japanese Patent Laid-open No. 2001-110817).

The transmission/reception changeover RF switch for antennas in the past is applied to radio communication apparatuses designed to communicate at the same communication frequency fc. In the two-way communication of cellular phones, vehicle phones and the like, the FM (Frequency Modulation) modulation system or the PM (Pulse Modulation) modulation system is generally adopted. When an FM modulated signal is subjected to high-speed switching by such a switching device as FET, a signal distortion is generated due to the phase shift of frequency components in the FM modulated signal. Particularly, in the case of FET, the non-linearity of the internal capacitance in the OFF state is greater as compared with the internal resistance in the ON state, so that a large signal distortion is generated during the OFF period; moreover, the distortion is larger as the input power is greater. Therefore, when a signal distortion is generated in a transmitted signal, the noise power in the sideband waves is increased, giving bad influence on the reception in the adjacent channels; on the other hand, when a signal distortion is generated in a received signal, it causes intermodulation or cross modulation.

As for enhancement of the performance of the transmission/reception changeover RF switches, efficient signal changeover can be achieved by lowering the resistance at the time when the FET is turned ON and/or by lowering the capacity at the time when the FET is OFF. In view of this, technical developments have been under way for achieving a lower ON resistance and/or a lower OFF capacity under the condition of a single gate width. However, although a lower ON resistance can be attained by shortening of the drain-source distance or the like means, the shortening of the drain-source distance or the like means leads adversely to an increase in the OFF capacity due to the mutual approaching of the electrodes. Thus, the lowering of the ON resistance and the lowering of the OFF capacity are generally in a trade-off relationship. An increase in the OFF capacity leads to a lower impedance at high frequencies, thereby causing an increase in leakage current and an increase of intermodulation distortion. In relation to this point, the approach of reducing the parasitic capacity by size reduction has its limits under the situations of the existing technology.

SUMMARY

One of the problems to be solved is that, when the drain-source distance is shortened in order to lower the ON resistance, the OFF capacity is adversely increased due to the mutual approaching of the drain and source electrodes, so that the lowering of the ON resistance and the lowering of the OFF capacity are generally in the trade-off relationship. Another problem to be solved lies in that an increase in the OFF capacity leads to a lower impedance at high frequencies, causing an increase in leakage current and an increase of intermodulation distortion, and it is difficult by the existing technology to reduce the parasitic capacity through size reduction.

In order to solve the above problems, according to embodiment, there is provided a semiconductor device including a field effect transistor utilizing a heterojunction, the field effect transistor formed in a device formation region sectioned by a device separation region on a semiconductor substrate, wherein the device separation region is composed of a layer with a conductive impurity introduced therein, and an electrode to which a positive voltage is to be applied is formed on a surface of at least a part of the device separation region in the periphery of the field effect transistor, on the device separation region.

According to embodiment, there is provided a method of manufacturing a semiconductor device comprising a field effect transistor utilizing a heterojunction, the field effect transistor formed in a device formation region sectioned by a device separation region on a semiconductor substrate, the method being most characterized by the step of forming the device separation region through forming a layer device separated by implantation of an ion into the semiconductor substrate, and forming an electrode to which a positive voltage is to be applied, on a surface of at least a part of the device separation region in the periphery of the field effect transistor.

In the semiconductor device according to an embodiment, an electrode to which a positive voltage is to be applied is formed in a device separation region of a semiconductor substrate including a semiconductor layer laminated while including a semiconductor layer having a heterojunction on the semiconductor substrate, specifically, on a surface of at least a part of the device separation region in the periphery of a field effect transistor. Therefore, when the field effect transistor is used as an RF switch, it is possible to reduce the OFF-time capacity, to thereby reduce intermodulation distortion, and hence to provide an RF switch which shows low distortion and low loss.

In the method of manufacturing a semiconductor device according to embodiment of the present invention, an electrode to which a positive voltage is to be applied is formed in a device separation region of a semiconductor substrate including a semiconductor layer laminated while including a semiconductor layer having a heterojunction on the semiconductor substrate, specifically, on a surface of at least a part of the device separation region in the periphery of a field effect transistor. Therefore, when the field effect transistor formed is used as an RF switch, it is possible to reduce the OFF-time capacity, thereby to reduce intermodulation distortion, and hence to manufacture an RF switch which shows low distortion and low loss.

BRIEF DESCRIPTION OF THE FIGURES

FIG. 5 is a schematic configurational sectional diagram showing an ordinary field effect transistor having a heterojunction according to the related art, as a comparative example;

FIG. 6 is a plan layout diagram showing an example of the plan layout of substrate voltage applying electrodes;

FIGS. 8A to 8B are plan layout diagrams showing examples of the plan layout of the substance voltage applying electrodes;

DETAILED DESCRIPTION

The need to provide an RF switch showing low distortion and low loss has been fulfilled by providing an electrode for applying a positive voltage in a device separation region.

Embodiment 1

Figure 1:
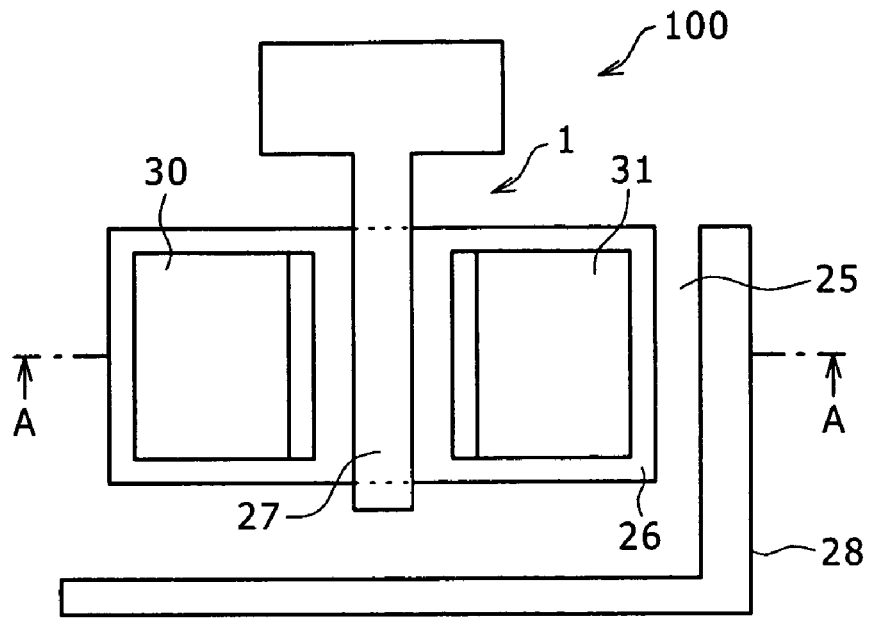
FIG. 1 is a plan layout diagram showing the semiconductor device according to a first embodiment of the present invention.

A first embodiment of the semiconductor device will be described referring to the plan layout diagram shown in FIG. 1 and a schematic sectional view along line A-A of FIG. 1 shown in FIG. 2.

Figure 2:
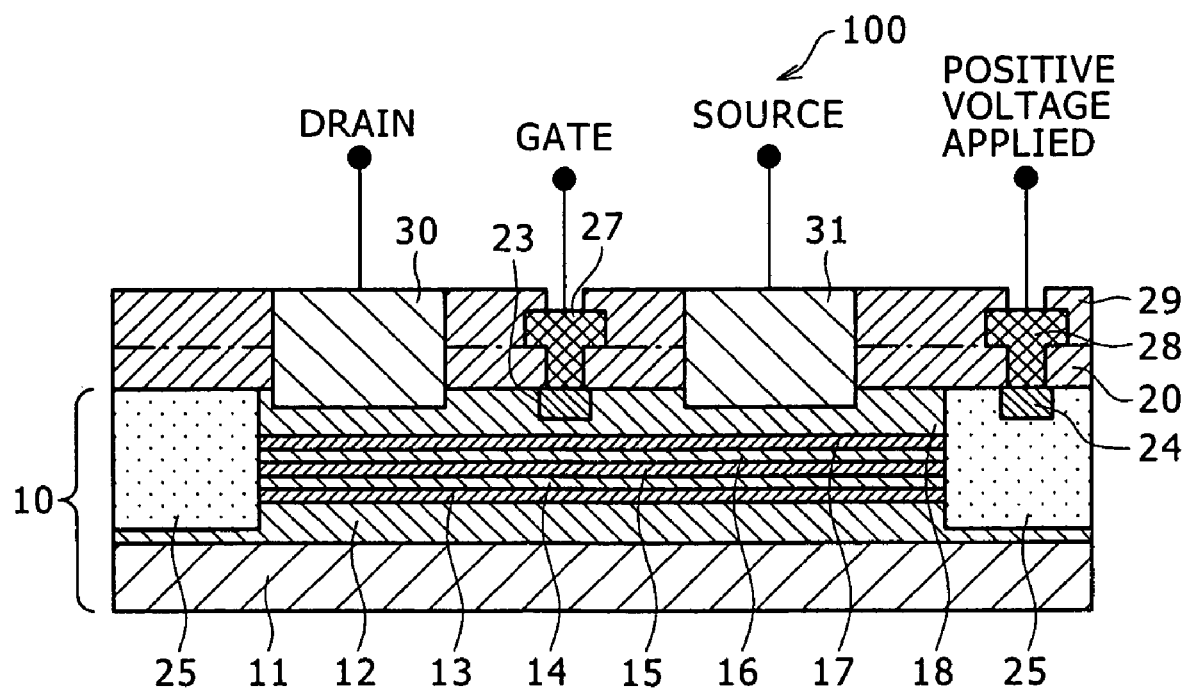
FIG. 2 is a schematic sectional diagram along line A-A of FIG. 1.

As shown in FIGS. 1 and 2, a semiconductor substrate 10 is formed as follows. For example, a buffer layer 12, an electron supply layer 13, a spacer layer 14, an electron transit layer 15, a spacer layer 16, an electron supply layer 17, and a barrier layer 18 are sequentially formed on a semi-insulating GaAs substrate 11. The electron supply layer 13 is formed, for example, of an $n^+$ AlGaAs layer. The spacer layer 14 is composed, for example, of a non-doped AlGaAs layer. The electron transit layer 15 is formed, for example, of a non-doped InGaAs layer. The spacer layer 16 is composed, for example, of non-doped AlGaAs layer. The electron supply layer 17 is formed, for example, of an $n^+$ AlGaAs layer. The barrier layer 18 is composed, for example, of an n AlAgAs layer. Namely, the semiconductor substrate 10 has a configuration in which a semiconductor layer including a semiconductor layer having a heterojunction composed of the electron supply layer 13, the spacer layer 14, the electron transit layer 15, the spacer layer 16, and the electron supply layer 17 is laminated on the buffer layer 12 on the semi-insulating GaAs substrate 11.

In the barrier layer 18 and the device separation region 25 which will be described later, first conduction type ($p^+$ type) diffusion layers 23 and 24 are formed in a predetermined region to be a gate region of a field effect transistor and in a region where an electrode for applying a substrate voltage is to be laid out. The diffusion layers 23 and 24 are formed, for example, by selective diffusion of zinc (Zn) as a p-type impurity. It should be noted that p-type impurities other than zinc (Zn) may be used in place of zinc (Zn).

Further, the device separation region 25 is formed over the range from the barrier layer 18 to the buffer layer 12, of the substrate 10. The device separation region 25 is for electrically separating (isolating) an active region 26 in which to form a field effect transistor 1, and is formed, for example, by implantation of an impurity (e.g., boron) ion. Incidentally, the diffusion layer 24 is formed on the surface side of the device separation region 25.

An insulation film 20 is formed on the substrate 10. The insulation film 20 is formed, for example, by forming a silicon nitride film in a thickness of about 300 nm.

A gate electrode 27 is formed on the diffusion layer 23 formed in the predetermined region to be the gate region of the field effect transistor 1. In addition, an electrode 28 for applying the substrate voltage is formed on the diffusion layer 24 formed in the region where the electrode for applying the substrate voltage is planned to be laid out. The electrode 28 is formed, for example, so as to surround at least a part of the periphery of the field effect transistor 1. For instance, the electrode 28 is formed on the device separation region 25 and in an L shape, as viewed on a plan layout basis, so as to continuously surround two sides of the field effect transistor 1. As each of the gate electrode 27 and the electrode 28, for example, a metal laminated film composed of titanium (Ti), platinum (Pt), and gold (Au) in this order from the lower side can be used.

An insulation film 29 is further formed on the surface of the insulation film 20. The insulation film 29 is for covering the gate electrode 27 and the electrode 28, and is composed, for example, of a silicon nitride film.

In the insulation films 29 and 20, there are formed a drain electrode 30 and a source electrode 31 which are connected to the barrier layer 18. As each of the drain electrode 30 and the source electrode 31, for example, a laminated film composed of a nickel (Ni) layer, a germanium (Ge) layer and a gold (Au) layer in this order from the lower side can be used.

Furthermore, predetermined wirings are connected to the drain electrode 30, the source electrode 31, the gate electrode 27 and the voltage applying electrode 28 so that a positive voltage will be applied to the electrode 28 from a positive power supply (not shown).

In the semiconductor device 100 according to an embodiment, in the device separation region 25 of the semiconductor substrate 10 in which the semiconductor layer (ranging from the buffer layer 12 to the barrier layer 18) including the semiconductor layer having the heterojunction (the electron supply layer 13, the spacer layer 14, the electron transit layer 15, the spacer layer 16, and electron supply layer 17) is laminated on the semiconductor substrate (semi-insulating GaAs substrate 11), the electrode 28 to which a positive voltage is applied is formed on the surface of at least a part of the device separation region 25 in the surroundings of the field effect transistor 1, so that when the field effect transistor 1 is used as an RF switch, the OFF-time capacity can be reduced, whereby intermodulation distortion can also be reduced. Accordingly, it is possible to provide an RF switch which shows low distortion and low loss.

Now, exemplary structures of the substrate voltage applying electrode 28 will be described below referring to FIGS. 3 and 4.

Figure 3:
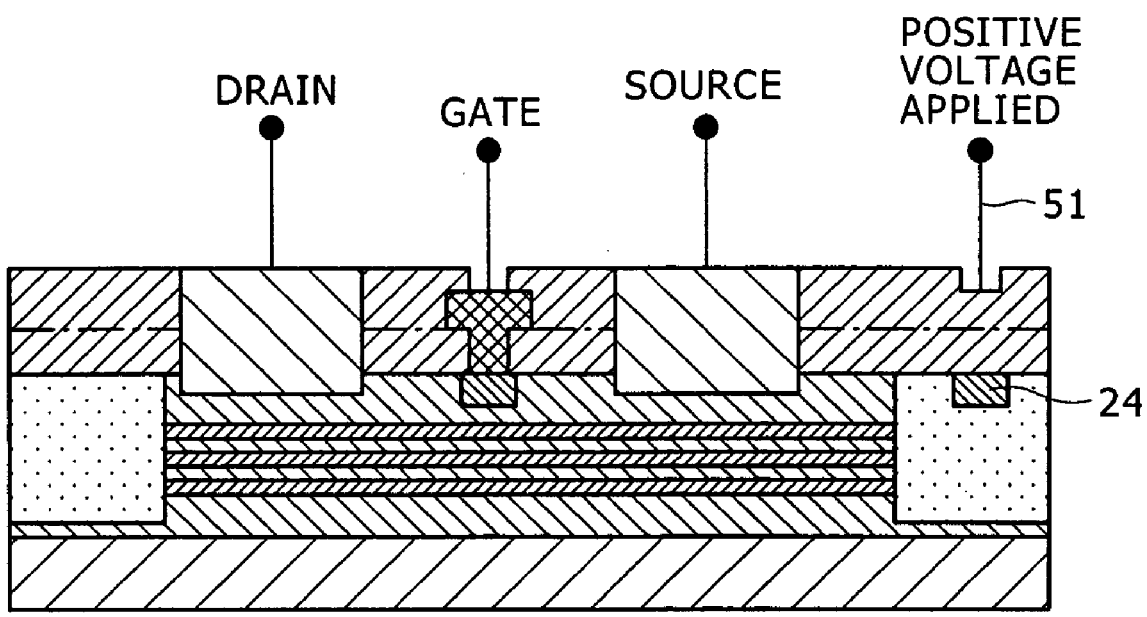
FIG. 3 is a schematic configurational sectional diagram showing an exemplary structure of electrodes for applying a voltage to a substrate.

FIG. 3 shows a structure, as described above in reference to FIG. 1 and Embodiment 1, in which an electrode 28 is not formed but the diffusion layer 24 is used as a substrate voltage applying electrode. Therefore, a wiring 51 for supplying a positive voltage for application of the substrate voltage is connected to the diffusion layer 24. The other configurations are the same as those in Embodiment 1 described referring to FIGS. 1 and 2 described above.

Figure 4:
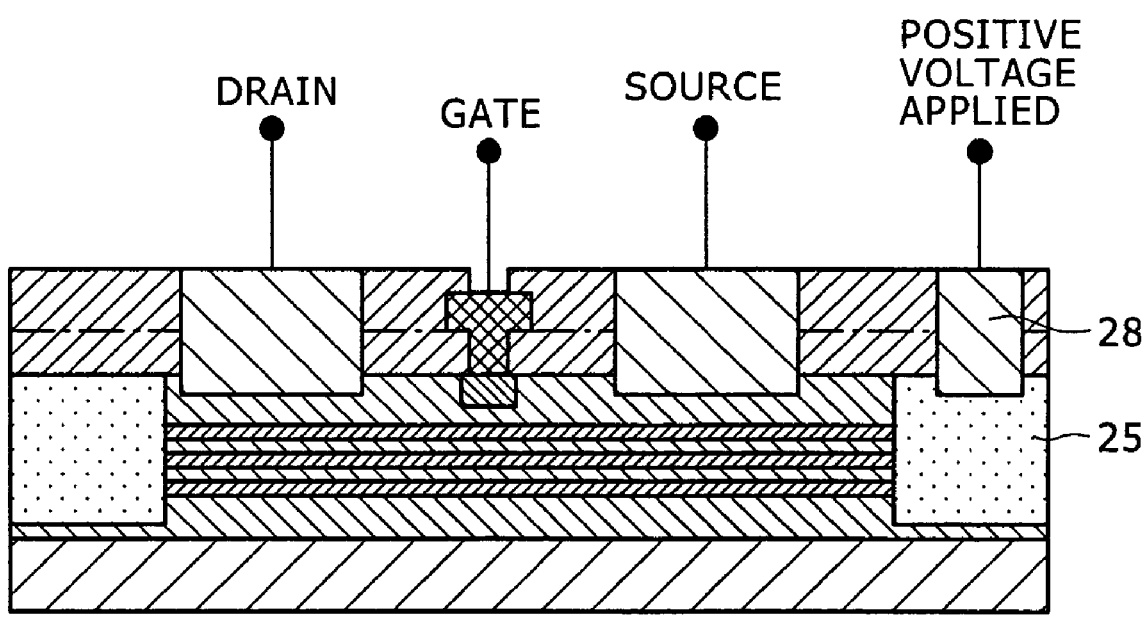
FIG. 4 is a schematic configurational sectional diagram showing an exemplary structure of electrodes for applying a voltage to a substrate.

FIG. 4 shows a structure in which a diffusion layer 24, as described above in Embodiment 1 and referring to FIGS. 1 and 2, is not formed but the substrate voltage applying electrode 28 is connected to the device separation region 25. In this configuration, an ohmic electrode is used as the electrode 28. As the ohmic electrode, there can be used, for example, a laminate film having a gold (Au) layer, a nickel (Ni) layer, a germanium (Ge) layer and a gold (Au) layer formed in this order from the lower side. Therefore, a wiring 51 for supplying a positive voltage for application of a substrate voltage is connected to the electrode 28. The other configurations are the same as those in Embodiment 1 described referring to FIGS. 1 and 2 above.

In the configurations described referring to FIGS. 3 and 4, also, the same functions or effects as those of the configuration in Embodiment 1 described referring to FIGS. 1 and 2 above can be obtained.

Incidentally, as a comparative example, a field effect transistor having a heterojunction of a standard type according to the related art is illustrated in a schematic configurational sectional diagram in FIG. 5.

As shown in FIG. 5, the field effect transistor 6 having a heterojunction of the standard type according to the related art has a configuration which is the same as in Embodiment 1, except that the substrate voltage applying electrode 28 and the diffusion layer 24 are not formed. Therefore, in the field effect transistor 6 having the heterojunction of the standard type according to the related art, it is impossible to apply a positive voltage to the substrate 10, so that when the field effect transistor 6 is used as an RF switch, the OFF-time capacity cannot be reduced and, hence, the intermodulation distortion cannot be reduced.

Now, exemplary plan layouts of the substrate voltage applying electrode 28 will be described below referring to plan layout diagrams shown in FIGS. 6, 7 and 8.

As shown in FIG. 6, in the field effect transistor 1 described in Embodiment 1 above, the substrate voltage applying electrode 28 is, for example, formed on the device separation region 25 and in a roughly rectangular shape on a plan layout basis so as to continuously surround the four sides of the field effect transistor 1. Although not shown, the substrate voltage applying electrode 28 may, for example, be formed on the device separation region 25 and in a roughly angular U shape on a plan layout basis so as to continuously surround the three sides of the field effect transistor 1. Although though not shown, the substrate voltage applying electrode 28 may, for example, be formed on the device separation region 25 and in a rectilinear shape on a plan layout basis on one side of the field effect transistor 1. In each of these cases, also, the same functions or effects as those of the configuration described above in Embodiment 1 referring to FIGS. 1 and 2 can be obtained.

Figure 7A:
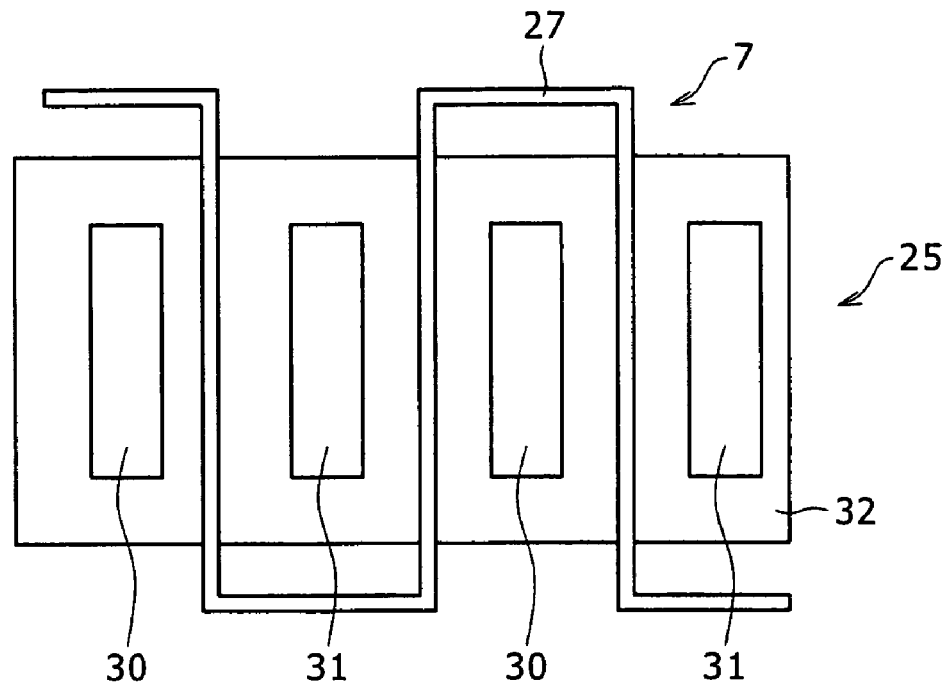
FIGS. 7A to 7B are plan layout diagrams showing an example of the plan layout of the substrate voltage applying electrodes.
Figure 7B:
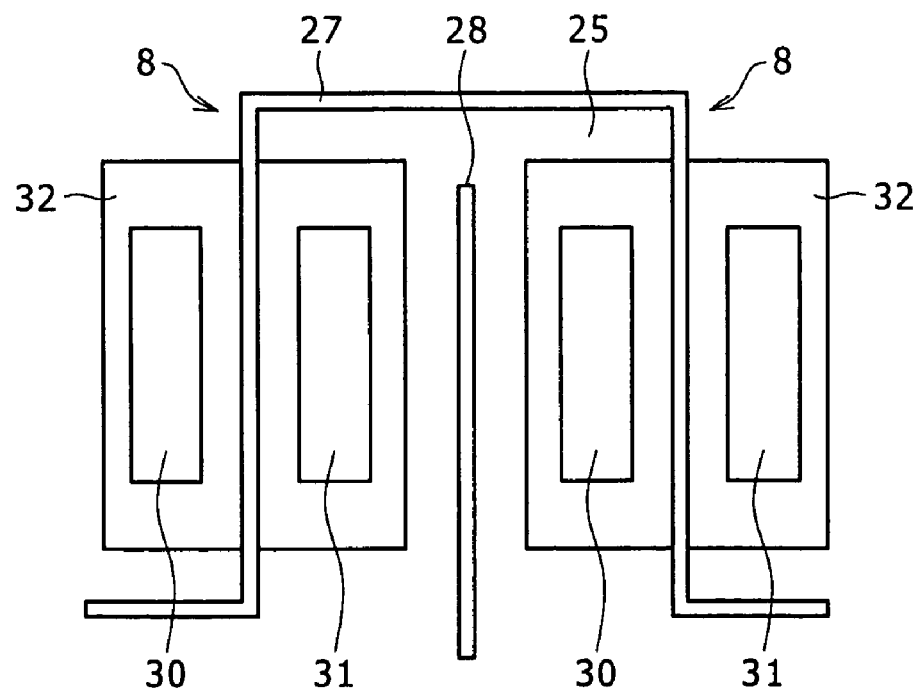

FIG. 7A shows a meander gate type field effect transistor 7 according to the related art. The meander gate type field effect transistor 7 has a structure in which a plurality of sets of a drain electrodes 30 and source electrodes 31 are disposed on an active region (device formation region) 32 electrically sectioned by device separation regions 25, and a gate electrode 27 is so formed as to be disposed zigzag and continuously between each adjacent pair of drain electrodes 30 and source electrodes 31. In order to apply the substrate voltage applying electrodes of the embodiment to such a semiconductor device, it suffices that as shown in FIG. 7B, the active regions (device formation regions) 32 in which to form the drain and the source are electrically sectioned by the device separation region 25 on the basis of each field effect transistor 8, the gate electrode 27 is so formed as to pass zigzag between the drain electrode 30 and the source electrode 31 formed on each active region, and the substrate voltage applying electrode 28 is formed on the device separation region 25 between the active regions.

FIG. 8A shows a structure in which a plurality of stages (a plurality of rows) of the meander gate type field effect transistors 7 according to the related art are formed. While a three-stage stack configuration is shown in the drawing, it should be appreciated that configurations including four or more stages may also be adopted in the same way. In order to apply the substrate voltage applying electrode of the present invention to such a semiconductor device, it suffices that as shown in FIG. 8B, the substrate voltage applying electrode 28 is formed on the device separation region 25 between the field effect transistors 7 of the adjacent stages (adjacent rows).

With each of the configurations shown in FIGS. 6 to 8, also, the same functions or effects as those of the configuration in Embodiment 1 described above and referring to FIGS. 1 and 2 can be obtained.

Embodiment 2

Figure 9:
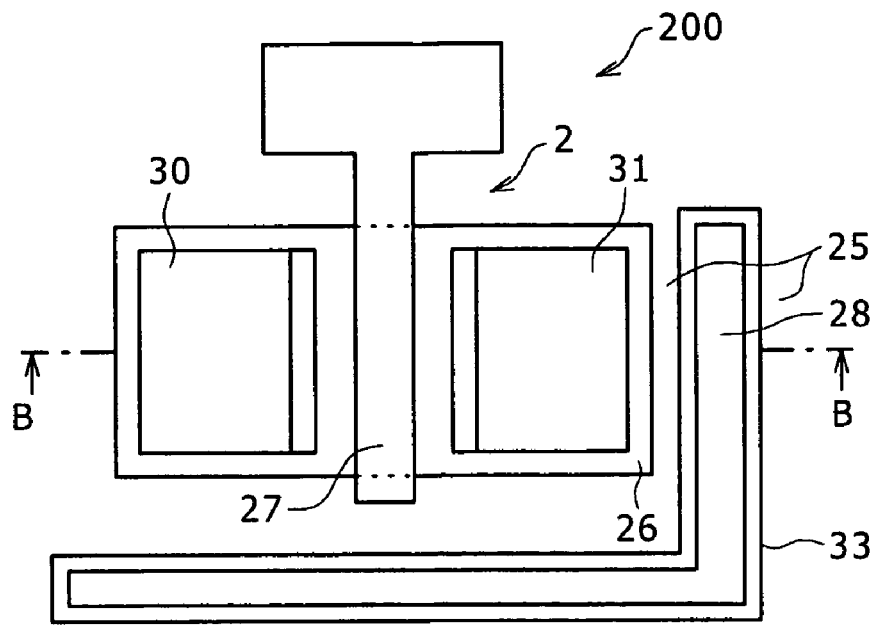
FIG. 9 is a plan layout diagram showing a semiconductor device according to a second embodiment of the present invention.

A second embodiment of the semiconductor device according to the present invention will be described, referring to a plan layout diagram shown in FIG. 9 and a schematic sectional diagram along line B-B of FIG. 9 shown in FIG. 10.

Figure 10:
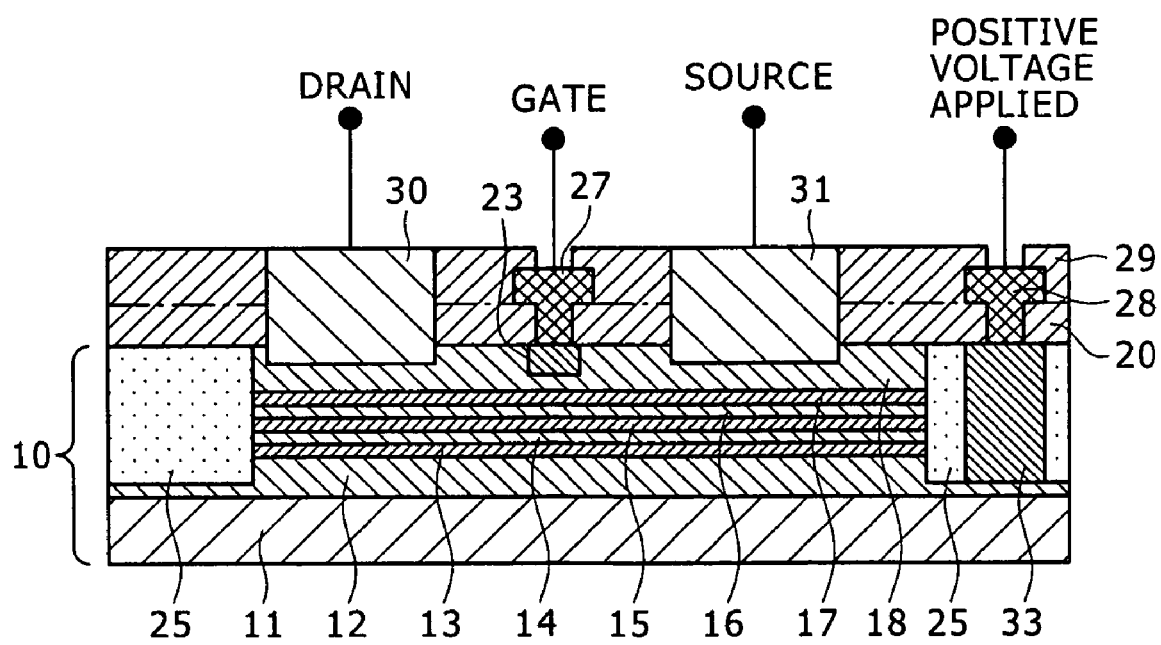
FIG. 10 is a schematic sectional diagram along line B-B of FIG. 9.

As shown in FIGS. 9 and 10, a semiconductor substrate 10 is formed as follows. For example, a buffer layer 12, an electron supply layer 13, a spacer layer 14, an electron transit layer 15, a spacer layer 16, an electron supply layer 17, and a barrier layer 18 are sequentially formed on a semi-insulating GaAs substrate 11. The electron supply layer 13 is formed, for example, of an n$^+$ AlGaAs layer. The spacer layer 14 is composed, for example, of a non-doped AlGaAs layer. The electron transit layer 15 is formed, for example, of a non-doped InGaAs layer. The spacer layer 16 is composed, for example, of a non-doped AlGaAs layer. The electron supply layer 17 is formed, for example, of an n$^+$ AlGaAs layer. The barrier layer 18 is composed, for example, of an n AlGaAs layer. Namely, the semiconductor substrate 10 has a structure in which a semiconductor layer laminated including a semiconductor layer having a heterojunction composed of the electron supply layer 13, the spacer layer 14, the electron transit layer 15, the spacer layer 16, and the electron supply layer 17 is formed on the buffer layer 12 on the semi-insulating GaAs substrate 11.

The barrier layer 18 is provided with a diffusion layer 23 of a first conduction type (p$^+$ type) in a predetermined region which will be a gate region of a field effect transistor. The diffusion layer 23 is formed, for example, by selective diffusion of zinc (Zn) which is a p-type impurity, but other p-type impurities than zinc (Zn) may also be used.

Further, the substrate 10 is provided with a device separation region 25 over the range from the barrier layer 18 to the buffer layer 12. The device separation region 25 is for electrically separate an active region 26 where to form the transistor, and is formed, for example, by implantation of an impurity (e.g., boron) ion.

In a region where to dispose an electrode for applying a substrate voltage, of the device separation region 25, a layer 33 is formed which is device separated by implantation of an ion in a higher concentration than that in the device separation region 25. The device-separated layer 33 is composed of a p-type region having a higher concentration than that of the device separation region 25. Where the dose in forming the device separation region 25 by ion implantation is, for example, $9 \times 10^{12}$ to $5 \times 10^{13}$ cm$^2$, the dose in forming the device-separated layer 33 by ion implantation is, for example, $1 \times 10^{13}$ to $1 \times 10^{15}$ cm$^2$.

An insulation film 20 is formed on the substrate 10. The insulation film 20 is formed, for example, by forming a silicon nitride film in a thickness of about 300 nm.

A gate electrode 27 is formed on the diffusion layer 23 formed in the predetermined region which will be the gate region of the field effect transistor 2. In addition, an electrode 28 for app lying a substrate voltage is formed on the device-separated layer 33 formed in the region where to dispose the electrode for applying the substrate voltage. The electrode 28 is formed, for example, so as to surround at least a part of the periphery of the field effect transistor 2. For example, the electrode 28 is formed on the device separation region 25 and in an L shape on a plan layout basis so as to continuously surround two sides of the field effect transistor 2. In addition, the electrode 28 may have any of the configurations shown in FIGS. 6, 7B, and 8B. Besides, the gate electrode 27 and the electrode 28 may be formed by use of a metal laminate film composed, for example, of titanium (Ti), platinum (Pt) and gold (Au) in this order from the lower side.

On the surface of the insulation film 20, an insulation film 29 is further formed. The insulation film 29 is for protecting the gate electrode 27 and the electrode 28, and can be composed, for example, of a silicon nitride film.

A drain electrode 30 and a source electrode 31 which are connected to the barrier layer 18 are formed in the insulation films 29 and 20. As each of the drain electrode 30 and the source electrode 31, for example, a laminate film composed of a nickel (Ni) layer, a germanium (Ge) layer, and a gold (Au) layer in this order from the lower side can be used.

Further, predetermined wirings are applied to the drain electrode 30, the source electrode 31, the gate electrode 27, and the voltage applying electrode 28 so that a positive voltage will be applied from a positive power supply (not shown) to the electrode 28.

The semiconductor device 200 according to an embodiment has a configuration wherein the electrode 28 to which a positive voltage is applied is formed in the device separation region 25 of the semiconductor substrate 10 comprising the semiconductor layer (ranging from the buffer layer 12 to the barrier layer 18) laminated while including the semiconductor layer (the electron supply layer 13, the spacer layer 14, the electron transit layer 15, the spacer layer 16, and the electron supply layer 17) having the heterojuction on the semiconductor substrate (the semi-insulating GaAs substrate 11), specifically, on the surface of at least a part of the device separation region 25 in the periphery of the field effect transistor 2. Therefore, when the field effect transistor 2 is used as an RF switch, the OFF-time capacity can be reduced. This makes it possible to reduce also the intermodulation distortion. Therefore, it is possible to provide an RF switch showing low distortion and low loss. Furthermore, with the electrode 28 provided on the layer 33 device separated by implantation of an ion in a higher concentration than that in the device separation region 25, the OFF capacity reducing effect is further enhanced, and it is possible to provide an RF switch showing a lower distortion and a lower loss.

Embodiment 3

Figure 11:
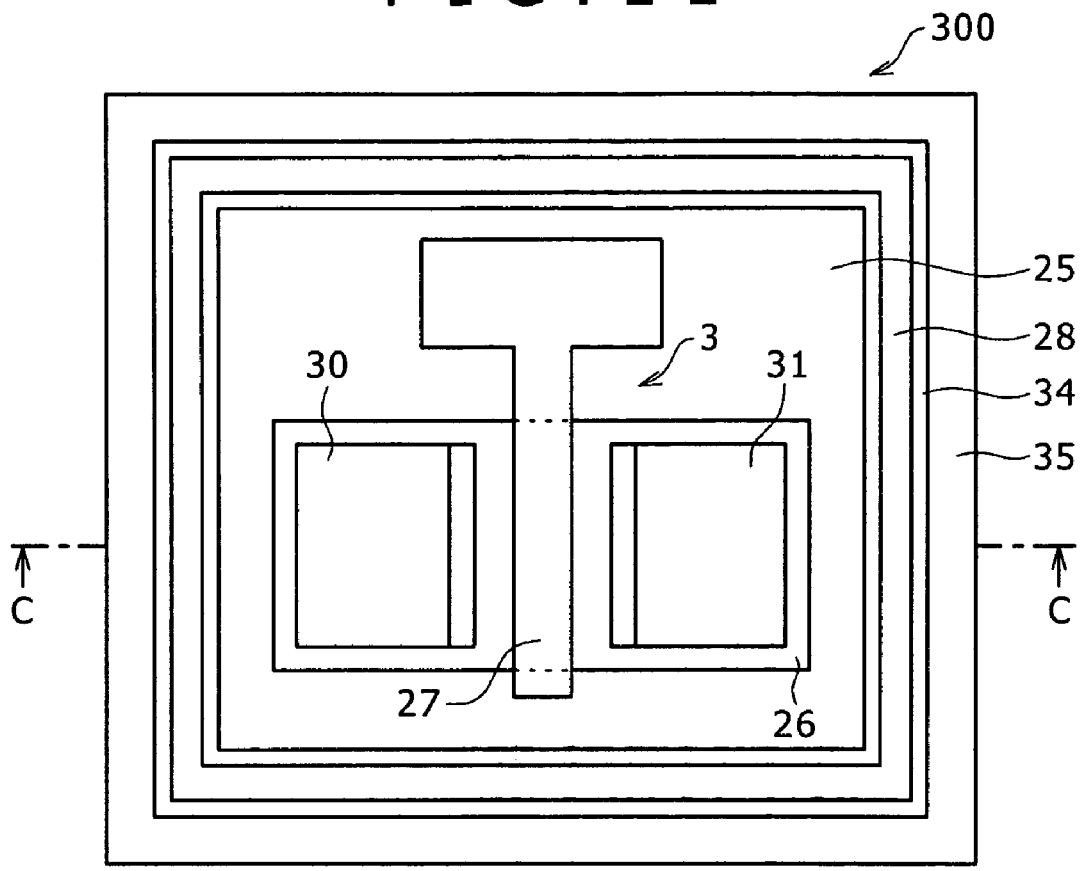
FIG. 11 is a plan layout diagram showing a semiconductor device according to a third embodiment of the present invention.

A third embodiment of the semiconductor device will be described referring to a plan layout diagram shown in FIG. 11 and a schematic sectional diagram along line C-C of FIG. 11 shown in FIG. 12.

Figure 12:
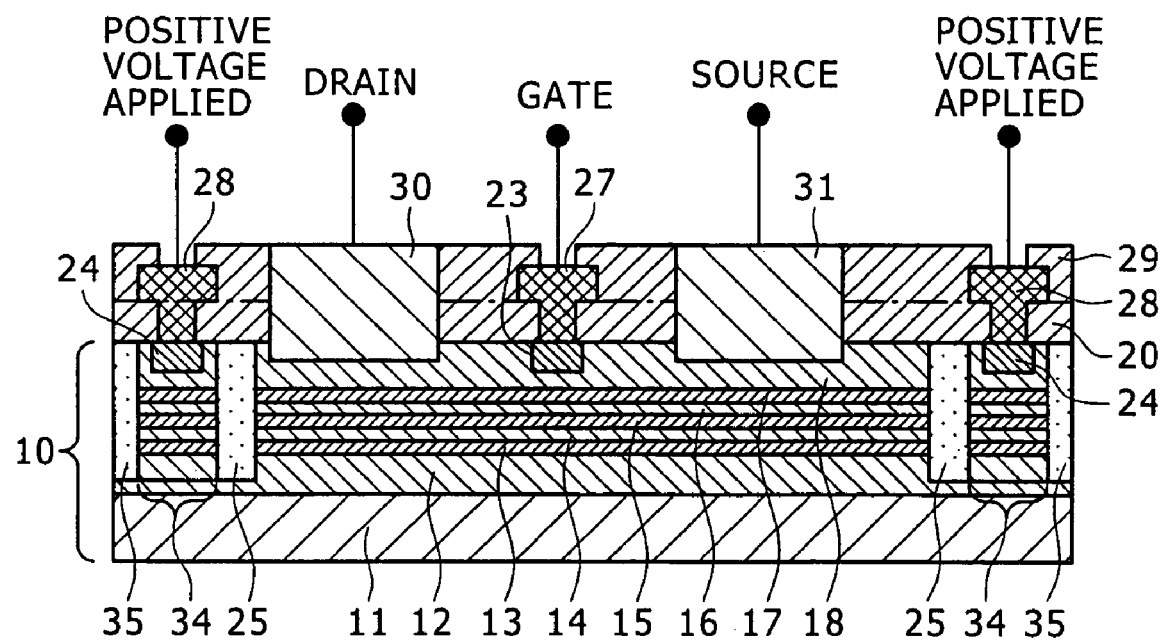
FIG. 12 is a schematic sectional diagram along line C-C of FIG. 11.

As shown in FIGS. 11 and 12, a semiconductor substrate 10 is formed as follows. For example, a buffer layer 12, an electron supply layer 13, a spacer layer 14, an electron transit layer 15, a spacer layer 16, an electron supply layer 17, and a barrier layer 18 are sequentially formed on a semi-insulating GaAs substrate 11. The buffer layer 12 is composed, for example, of a non-doped AlGaAs layer. The electron supply layer 13 is formed, for example, of an n$^+$ AlGaAs layer. The spacer layer 14 is composed, for example, of a non-doped AlGaAs layer. The electron transit layer 15 is formed, for example, of a non-doped InGaAs layer. The spacer layer 16 is composed, for example, of a non-doped AlGaAs layer. The electron supply layer 17 is formed, for example, of an n$^+$ AlGaAs layer. Namely, the semiconductor layer 10 has a configuration in which a semiconductor layer laminated while including a semiconductor layer composed of the electron supply layer 13, the spacer layer 14, the electron transit layer 15, the spacer layer 16, and the electron supply layer 17 and having a heterojunction is formed on the buffer layer 12 on the semi-insulating GaAs substrate 11.

In the barrier layer 18, diffusion layers 23 and 24 of a first conduction type (p$^+$ type) are formed in a predetermined region which will be a gate region of a field effect transistor and in a region where to dispose an electrode for applying a substrate voltage. The diffusion layers 23 and 24 are formed, for example, by selective diffusion of zinc (Zn) which is a p-type impurity, but other p-type impurities than zinc (Zn) may also be used.

Furthermore, over the range from the barrier layer 18 to the buffer layer 12 in the substrate 10, a device separation region 25 is formed so as to surround an active region 26 of the field effect transistor 3. The device separation region 25 is for electrically separating the active region 26 in which to form the field effect transistor 3, and is formed, for example, by implantation of an impurity (e.g., boron) ion. Further, an active region 34 configured in the same manner as the active region 26 of the field effect transistor 3 is formed on the outer side of the device separation region 25, and, further, a device separation region 35 similar to the device separation region 25 is formed on the outer side of the active region 34. The diffusion layer 24 is formed on the face side of the active region 34.

An insulation film 20 is formed on the substrate 10. The insulation film 20 is formed, for example, by forming a silicon nitride film in a thickness of about 300 nm.

A gate electrode 27 is formed on the diffusion layer 23 formed in the predetermined region which will be the gate region of the field effect transistor 3. In addition, an electrode 28 for applying a substrate voltage is formed on the diffusion layer 24 formed in the region in which to dispose the electrode for applying the substrate voltage. The electrode 28 is formed, for example, so as to surround at least a part of the periphery of the field effect transistor 3. For example, the electrode 28 is formed on the active region 34 and in a roughly rectangular shape on a plan layout basis so as to continuously surround the field effect transistor 3. As each of the gate electrode 27 and the electrode 28, for example, a metal laminate film composed of titanium (Ti), platinum (Pt), and gold (Au) in this order from the lower side can be used. Incidentally, the shape of the electrode 28 may also be an L shape, a roughly angular U shape, a rectilinear shape or the like shape.

On the surface of the insulation film 20, an insulation film 29 is further formed. The insulation film 29 is for protecting the gate electrode 27 and the electrode 28, and can be formed, for example, of a silicon nitride film.

A drain electrode 30 and a source electrode 31 which are connected to the barrier layer 18 are formed in the insulation films 29 and 20. As each of the drain electrode 30 and the source electrode 31, for example, a laminate film composed of a nickel (Ni) layer, a germanium (Ge) layer, and a gold (Au) layer in this order from the lower side can be used.

Further, predetermined wirings are connected to the drain electrode 30, the source electrode 31, the gate electrode 27, and the voltage applying electrode 28 so that a positive voltage will be applied from a positive power supply (not shown) to the electrode 28.

For the electrode 28, the electrode configuration described referring to FIGS. 3 and 4 above may also be adopted.

The semiconductor device 300 according to the present invention has a configuration wherein the electrode 28 to which a positive voltage is to be applied is formed in the device separation region 25 of the semiconductor substrate 10 comprising the semiconductor layer (ranging from the buffer layer 12 to the barrier layer 18) laminated while including the semiconductor layer (the electron supply layer 13, the spacer layer 14, the electron transit layer 15, the spacer layer 16, and the electron supply layer 17) having the heterojunction on the semiconductor substrate (the semi-insulating GaAs substrate 11), specifically, on the surface of at least a part of the device separation region 25 in the periphery of the field effect transistor 3; therefore, when the field effect transistor 3 is used as an RF switch, the OFF-time capacity can be reduced. This makes it possible to reduce also the intermodulation distortion. Therefore, it is possible to provide an RF switch showing low distortion and low loss.

Embodiment 4

Figure 13:
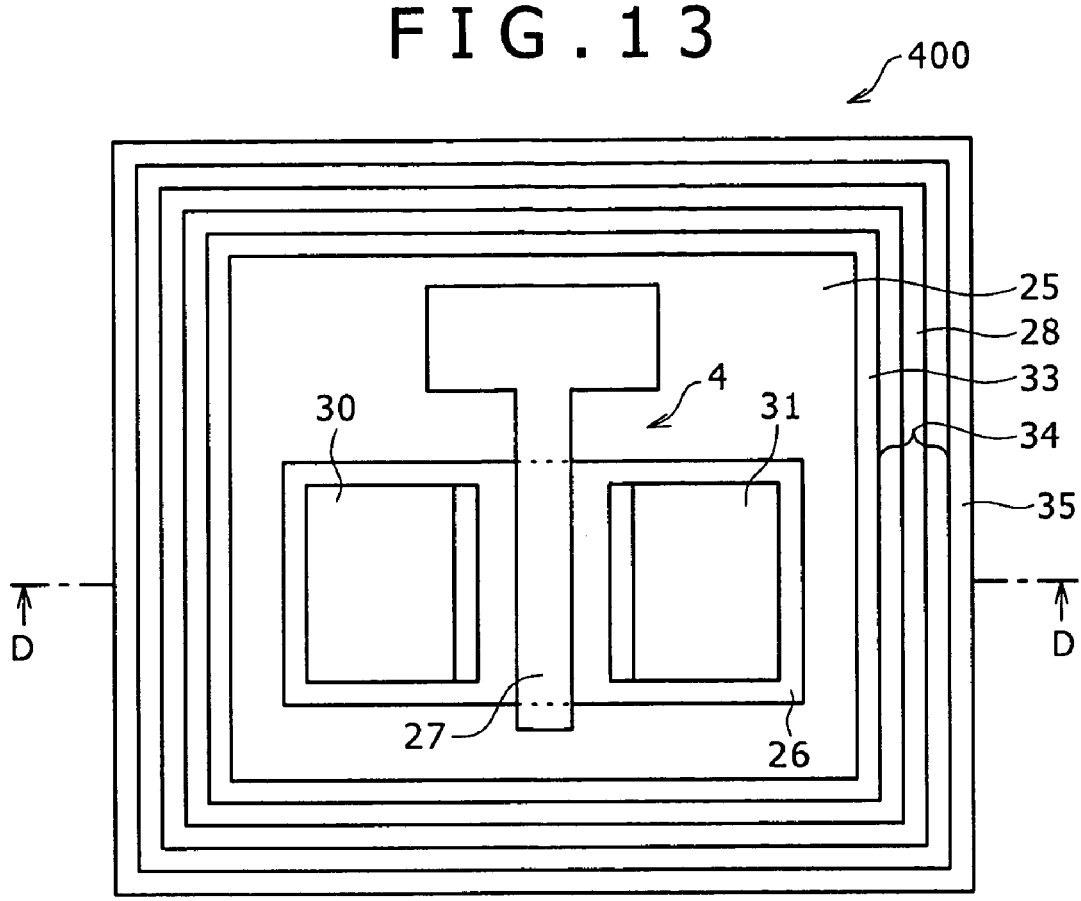
FIG. 13 is a plan layout diagram showing a fourth embodiment of the semiconductor device according to the present invention.

A fourth embodiment of the semiconductor device according to the present invention will be described referring to a plan layout diagram shown in FIG. 13 and a schematic sectional diagram along line D-D of FIG. 13 shown in FIG. 14.

Figure 14:
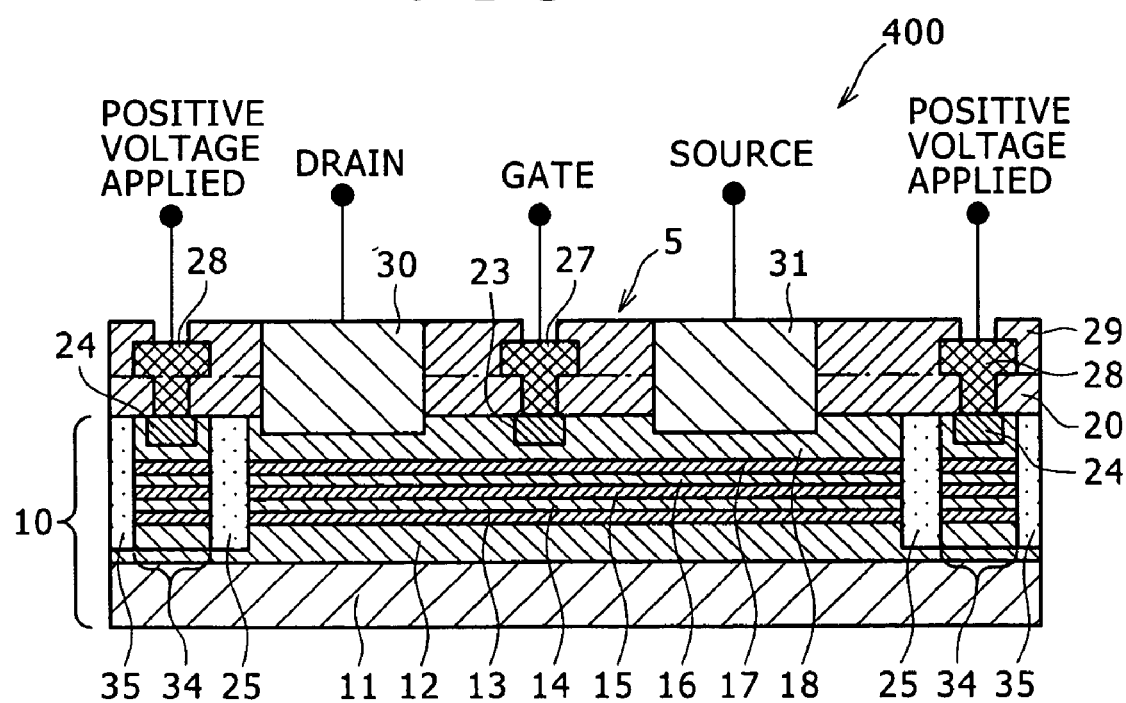
FIG. 14 is a schematic sectional diagram along line D-D of FIG. 13.

As shown in FIGS. 13 and 14, a semiconductor substrate 10 is formed as follows. For example, a buffer layer 12, an electron supply layer 13, a spacer layer 14, an electron transit layer 15, a spacer layer 16, an electron supply layer 17, and a barrier layer 18 are sequentially formed on a semi-insulating GaAs substrate 11. The buffer layer 12 is composed, for example, of a non-doped AlGaAs layer. The electron supply layer 13 is formed, for example, of an n$^+$ AlGaAs layer. The spacer layer 14 is composed, for example, of a non-doped AlGaAs layer. The electron transit layer 15 is formed, for example, of a non-doped InGaAs layer. The spacer layer 16 is composed, for example, of a non-doped AlGaAs layer. The electron supply layer 17 is formed, for example, of an n$^+$ AlGaAs layer. The barrier layer 18 is composed, for example, of an n AlGaAs layer. Namely, the semiconductor substrate 10 has a configuration in which a semiconductor layer laminated while including a semiconductor layer composed of the electron supply layer 13, the spacer layer 14, the electron transit layer 15, the spacer layer 16, and the electron supply layer 17 and having a heterojunction is formed on the buffer layer 12 on the semi-insulating GaAs substrate 11.

In the barrier layer 18, a diffusion layer 23 of a first conduction type (p$^+$ type) is formed in a predetermined region which will be a gate region of a field effect transistor. The diffusion layer 23 is formed, for example, by selective diffusion of zinc (Zn) which is a p-type impurity, but other p-type impurities than zinc (Zn) can also be used.

In addition, over the range from the barrier layer 18 to the buffer layer 12 in the substrate 10, a device separation region 25 is formed so as to surround an active region 26 of the field effect transistor 4. The device separation region 25 is for electrically separating the active region 26 where the field effect transistor 4 is formed, and is formed, for example, by implantation of an impurity (e.g., boron) ion. Further, an active region 34 configured in the same manner as the active region 26 of the field effect transistor 4 is formed on the outer side of the device separation region 25, and, further, a device separation region 35 similar to the device separation region 25 is formed on the outer side of the active region 34. The diffusion layer 24 is formed on the face side of the active region 34.

Furthermore, a layer 33 device separated by implantation of an ion in a higher concentration than that in the device separation region 25 is formed between the device separation region 25 and the active region 34. The device-separated layer 33 is composed of a p-type region higher in impurity concentration than the device separation region 25. When the dose in forming the device separation region 25 by ion implantation is, for example, $9\times10^{12}$ to $5\times10^{13}$ cm², the dose in forming the device-separated layer 33 by ion implantation is, for example, $1\times10^{13}$ to $1\times10^{15}$ cm².

An insulation film 20 is formed on the substrate 10. The insulation film 20 is formed, for example, by forming a silicon nitride film in a thickness of about 300 nm.

A gate electrode 27 is formed on the diffusion layer 24 formed in the predetermined region which will be the gate region of the field effect transistor 4. In addition, an electrode 28 for applying a substrate voltage is formed on the diffusion layer 23 formed in a region where the electrode for applying the substrate voltage is to be disposed. The electrode 28 is formed, for example, so as to surround at least a part of the periphery of the field effect transistor 4. For example, the electrode 28 is formed on the active region 34 and in a roughly rectangular shape on a plan layout basis so as to continuously surround the field effect transistor 4. As each of the gate electrode 27 and the electrode 28, for example, a metal laminate film composed of titanium (Ti), platinum (Pt), and gold (Au) in this order from the lower side can be used. Incidentally, the shape of the electrode 28 may also be an L shape, a roughly angular U shape, a rectilinear shape or the like shape.

An insulation film 29 is further formed on the surface of the insulation film 20. The insulation film 29 is for protecting the gate electrode 27 and the electrode 28, and is composed, for example, of a silicon nitride film.

A drain electrode 30 and a source electrode 31 to be connected to the barrier layer 18 are formed in the insulation films 29 and 20. As each of the drain electrode 30 and the source electrode 31, for example, a laminate film composed of a nickel (Ni) layer, a germanium (Ge) layer, and a gold (Au) layer formed in this order from the lower side can be used.

Further, predetermined wirings are connected to the drain electrode 30, the source electrode 31, the gate electrode 27, and the voltage applying electrode 28 so that a positive voltage will be applied from a positive power supply (not shown) to the electrode 28.

For the electrode 28, the electrode configuration described referring to FIGS. 3 and 4 above may also be used.

The semiconductor device 400 according to an embodiment has a configuration wherein the electrode 28 to which the positive voltage is applied is formed in the device separation region 25 of the semiconductor substrate 10 comprising the semiconductor layer (ranging from the buffer layer 12 to the barrier layer 18) laminated while including the semiconductor layer (the electron supply layer 13, the spacer layer 14, the electron transit layer 15, the spacer layer 16, and the electron supply layer 17) having the heterojunction on the semiconductor substrate (semi-insulating GaAs substrate 11), specifically, on the surface of at least a part of the device separation region 25 in the periphery of the field effect transistor 4. Therefore, when the field effect transistor 4 is used as an RF switch, the OFF-time capacity can be reduced. This makes it possible to reduce also the intermodulation distortion. Therefore, it is possible to provide an RF switch showing low distortion and low loss.

Figure 15:
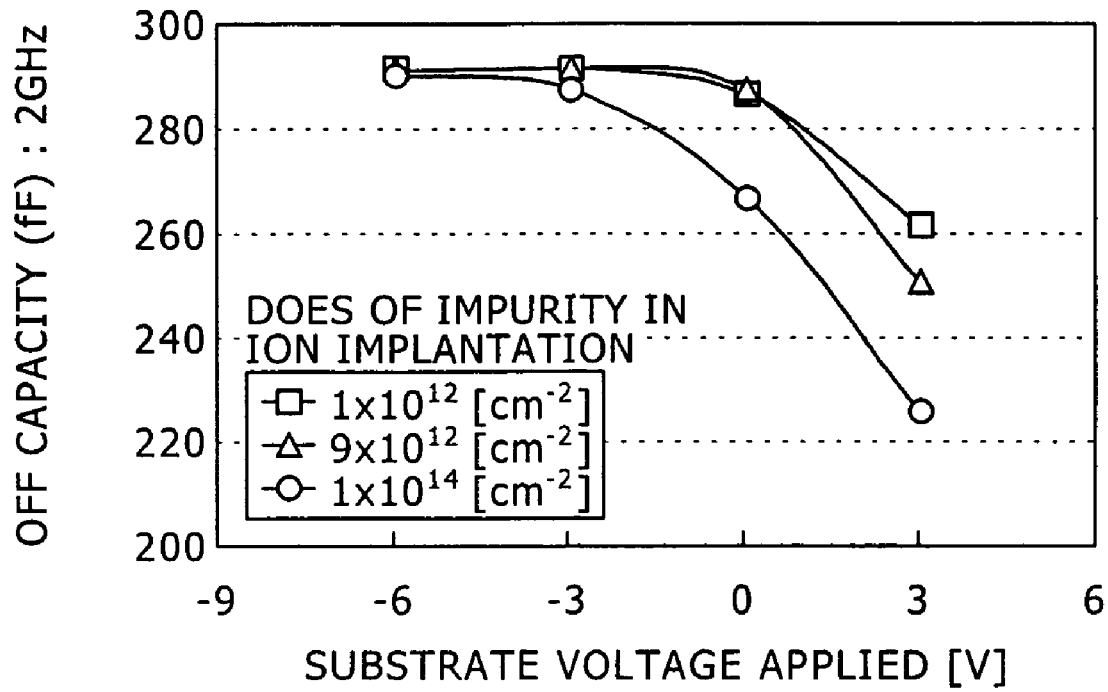
FIG. 15 is a diagram showing the relationship between a voltage applied from substrate voltage applying electrodes and the OFF capacity at the time when an RF switch field effect transistor is turned OFF, with the amount of an impurity implanted for forming a device separation region as a parameter.

Now, the relationship between the voltage applied from the substrate voltage applying electrode and the OFF capacity when the RF switch field effect transistor is turned OFF, with the dose of the impurity implanted for forming the device separation region as a parameter, will be described below referring to FIG. 15. In FIG. 15, the OFF capacity (fF) at the time of 2 GHz is taken on the axis of ordinates, and the substrate voltage applied (V) is taken on the axis of abscissas.

As shown in FIG. 15, the OFF capacity of the RF switch corresponds usually to the condition where a channel beneath the gate is depleted by applying a minus voltage to the gate terminal to thereby cut off the flow of a signal between the drain and the source. As the OFF capacity is smaller, it is possible to secure a higher impedance at high frequencies, and to make smaller the leakage current. In the semiconductor device according to an embodiment, a positive voltage is applied to the substrate 10 by the electrode 28 disposed on the device separation region 25 in the periphery of the field effect transistor 2 in the OFF state, whereby the effect thereof is further enhanced, and the OFF capacity can be lowered. In addition, by setting the dose of the impurity into the device separation region 25 to be not less than $9\times10^{12}$ cm², it can be expected that the effect is further enhanced.

Figure 16:
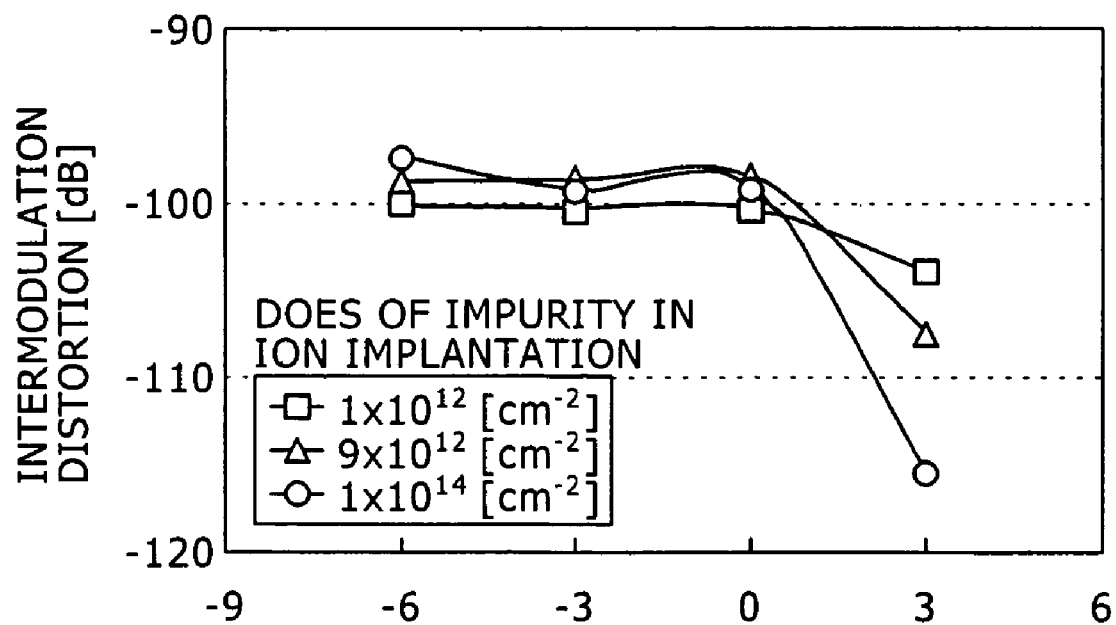
FIG. 16 is a diagram showing the relationship between a voltage applied from the substrate voltage applying electrodes and the intermodulation distortion of the RF switch field effect transistor, with the amount of the impurity implanted for forming the device separation region as a parameter.

Besides, the relationship between the voltage applied from the substrate voltage applying electrode and the intermodulation distortion of the RF switch field effect transistor will be described referring to FIG. 16. In FIG. 16, the intermediate distortion is taken on the axis of ordinates, and the substrate voltage applied (V) is taken on the axis of abscissas.

As shown in FIG. 16, a tendency similar to that of the OFF capacity is again observed for the intermodulation distortion, and it is seen that an RF switch field effect transistor showing low distortion and low loss can be provided by applying a positive voltage from the voltage applying electrode 28 formed on the outermost surface of the compound semiconductor layer.

Embodiment 5

A first embodiment of the method of manufacturing a semiconductor device according to the present invention will be described below referring to manufacturing step sectional diagrams shown in FIGS. 17A to 18C. FIGS. 17A to 18C illustrate the method of manufacturing a semiconductor device according to the first embodiment of the semiconductor device as above-described.

Figure 17A:
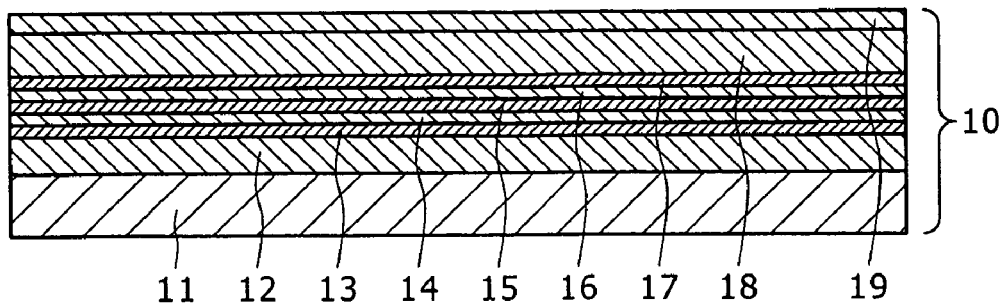
FIGS. 17A to 17D show manufacturing step sectional diagrams illustrating a first embodiment of the method of manufacturing a semiconductor device according to the present invention.

As shown in FIG. 17A, a semiconductor substrate 10 is formed as follows. For example, a buffer layer 12, an electron supply layer 13, a spacer layer 14, an electron transit layer 15, a spacer layer 16, an electron supply layer 17, a barrier layer 18, and a high concentration layer 19 are sequentially formed on a semi-insulating GaAs substrate 11. Each of the layers is formed, for example, by an epitaxial growth method, as follows. The buffer layer 12 is composed, for example, a non-doped AlGaAs layer. The electron supply layer 13 is formed, for example, of an n⁺ AlGaAs layer. The spacer layer 14 is composed, for example, of a non-doped AlGaAs layer. The electron transit layer 15 is formed, for example, of a non-doped InGaAs layer. The spacer layer 16 is composed, for example, of a non-doped AlGaAs layer. The electron supply layer 17 is formed, for example, of an n⁺ AlGaAs layer. The barrier layer 18 is composed, for example, of an n AlGaAs layer. The high concentration layer 19 is formed, for example, of an n⁺ GaAs layer doped in n type. The semiconductor substrate 10 is thus configured.

Figure 17B:
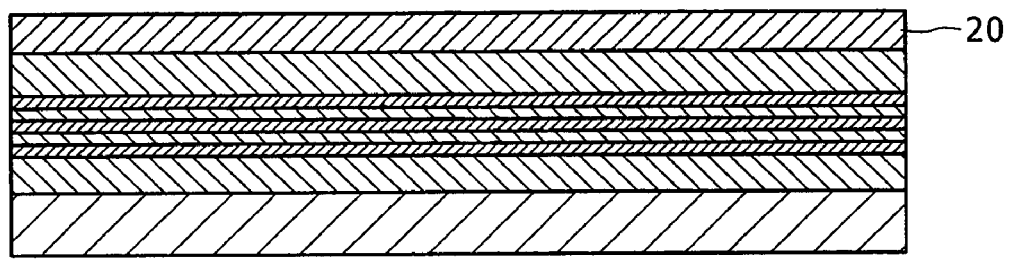

Next, as shown in FIG. 17B, the high concentration layer 19 (see FIG. 17A) is deprived of a predetermined region which becomes unnecessary in the course of formation of a field effect transistor, by an etching technology using an ordinary photoresist (not shown) as a mask, and thereafter the photoresist is removed. Subsequently, the insulation film 20 is formed. The insulation film 20 is formed, for example, by forming a silicon nitride film in a thickness of 300 nm.

Figure 17C:
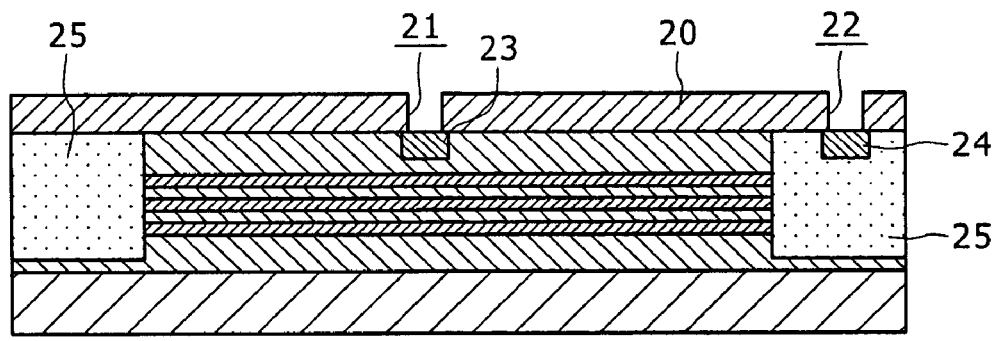

Next, as shown in FIG. 17C, the insulation film 20 in a predetermined region to be a gate region of the field effect transistor and in a region for disposing the electrode for applying the substrate voltage is removed, to form openings 21 and 22. Thereafter, selective diffusion of zinc (Zn) is conducted via the openings 21 and 22 while using the insulation film 20 as a mask, to form first conduction type (p-type) diffusion layers 23 and 24.

Subsequently, by an ion implantation technique using an ordinary photoresist as a mask (not shown), an impurity (e.g., boron) ion is implanted into the region for forming the device separation region, to form an electrical device separation region 25. The ion implantation amount, in the case of using boron as the impurity, is in the range of $9 \times 10^{12}$ to $5 \times 10^{15}$ cm$^2$, for example.

Figure 17D:
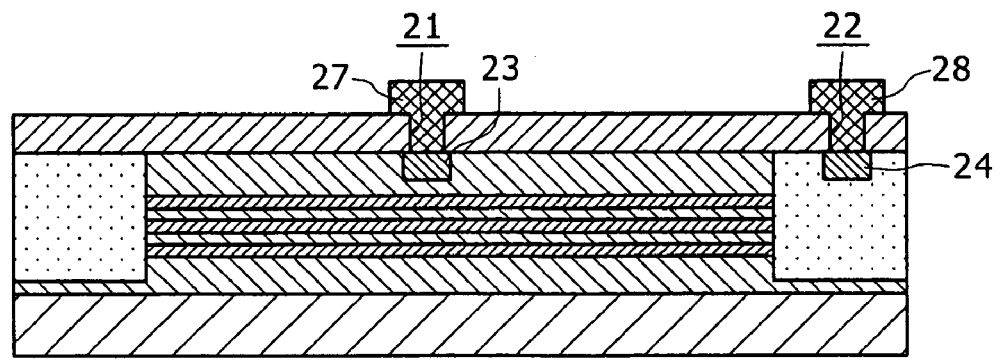

Next, as shown in FIG. 17D, by an ordinary lithographic technology, a photoresist film (not shown) provided with openings in the regions for forming the gate electrode and the voltage applying electrode on the openings 21 and 22 is formed, and the openings and the openings 21 and 22 are filled with a conductive film for forming electrodes by, for example, vapor deposition or sputtering. As the conductive film, for example, a metal laminate film composed of titanium (Ti), platinum (Pt), and gold (Au) in this order from the lower side is used. Thereafter, a lift-off treatment is conducted to form the gate electrode 27 on the first conduction type diffusion layer 23 from the metal laminate film. In this instance, a surface voltage applying electrode 28 to be connected is simultaneously formed on the diffusion layer 24.

Figure 18A:
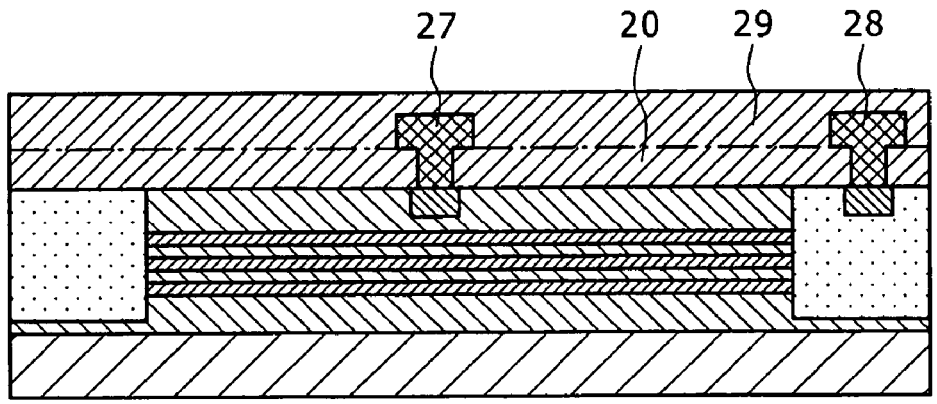
FIGS. 18A to 18C show manufacturing step sectional diagrams illustrating the first embodiment of the method of manufacturing a semiconductor device according to the present invention.

Subsequently, as shown in FIG. 18A, an insulation film 29 is further formed on the surface of the insulation film 20, to protect the gate electrode 27 and the electrode 28. The insulation film 29 is formed by forming a silicon nitride film, for example.

Figure 18B:
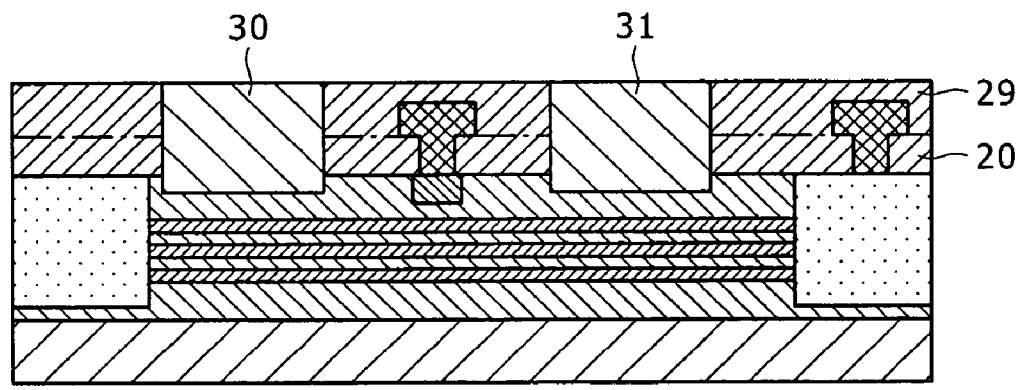

Next, as shown in FIG. 18B, a photoresist mask provided with openings in the regions in which to form drain and source electrodes is formed by an ordinary lithographic technique, and the insulation films 29 and 20 are removed by etching. Then, a conductive film to be the drain and source electrodes is deposited so as to fill up the removed portions, by vapor deposition or sputtering. As the conductive film, for example, a laminate film composed of a nickel (Ni) layer, a germanium (Ge) layer, and a gold (Au) layer in this order from the lower side is used. Thereafter, a lift-off treatment is conducted, to form the drain electrode 30 and the source electrode 31 from the laminate film.

Figure 18C:
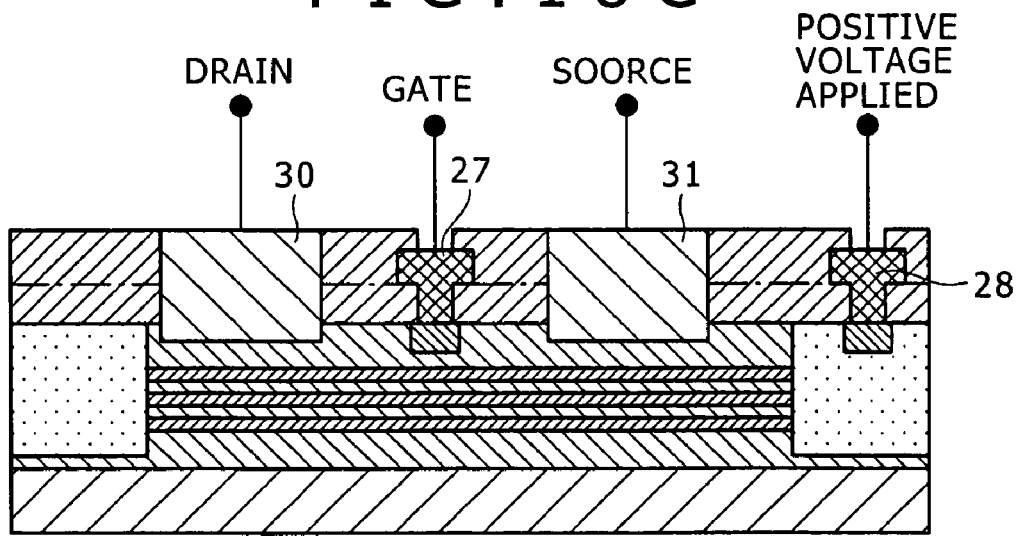

Subsequently, as shown in FIG. 18C, predetermined wirings are connected to the drain electrode 30, the source electrode 31, the gate electrode 27, and the voltage applying electrode 28 so that a positive voltage will be applied from a positive power supply (not shown) to the electrode 28.

In the method of manufacturing a semiconductor device according to an embodiment, the electrode 28 to which a positive voltage is to be applied is formed in the device separation region 25 of the semiconductor substrate 10 comprising the semiconductor layer (ranging from the buffer layer 12 to the barrier layer 18) laminated while including the semiconductor layer (the electron supply layer 13, the spacer layer 14, the electron transit layer 15, the spacer layer 16, and the electron supply layer 17) having the heterojunction on the semiconductor substrate (the semi-insulating GaAs substrate 11), specifically on the surface of at least a part of the device separation region 25 in the periphery of the field effect transistor 1. Therefore, when the field effect transistor 1 formed is used as an RF switch, the OFF-time capacity can be reduced, whereby the intermodulation distortion can also be reduced, so that it is possible to manufacture an RF switch showing low distortion and low loss.

Embodiment 6

A second embodiment of the method of manufacturing a semiconductor device will be described below referring to manufacturing step sectional diagrams shown in FIG. 19. FIG. 19 illustrates the method of manufacturing a semiconductor device according to the second embodiment of the semiconductor device as above-described.

Figure 19A:
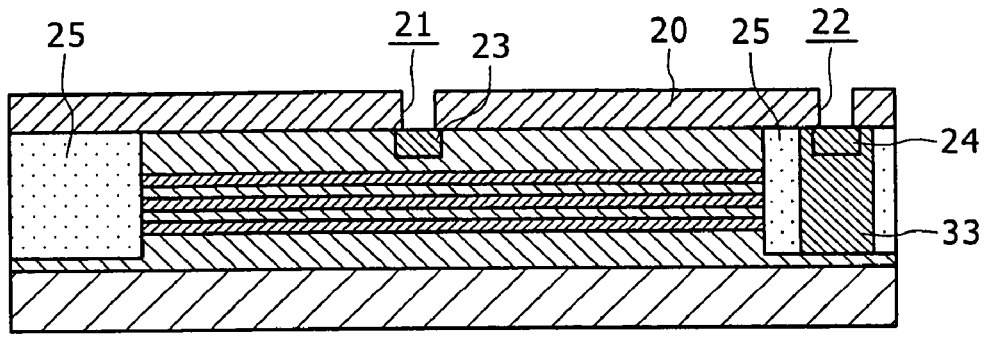
FIGS. 19A to 19D show manufacturing step sectional diagrams illustrating a second embodiment of the method of manufacturing a semiconductor device according to the present invention.

The same steps as described referring to FIGS. 17A and 17B above are carried out. Then, as shown in FIG. 19A, the insulation film 20 in a predetermined region to be the gate region of a field effect transistor and in the region for disposing the electrode for applying the substrate voltage is removed, to form openings 21 and 22. Thereafter, selective diffusion of zinc (Zn) is conducted via the openings 21 and 22 by using the insulation film 20 as a mask, to form first conduction type (p-type) diffusion layers 23 and 24.

Next, by an ion implantation technique using an ordinary photoresist as a mask (not shown), an impurity (e.g., boron) ion is implanted into the region to be the device separation region, to form the electrical device separation region. Where boron is used as the impurity, the ion implantation amount is, for example, $9 \times 10^{12}$ to $5 \times 10^{13}$ cm$^2$.

Further, by an ion implantation technique using an ordinary photoresist as a mask (not shown), an impurity (e.g., boron) ion is implanted into a region for forming a layer device separated by implantation of an ion in a higher concentration than that in the device separation region, to form a device-separated layer 33. In this case, when the dose in forming the device separation region 25 by ion implantation is, for example, $9 \times 10^{12}$ to $5 \times 10^{13}$ cm$^2$, the dose in forming the device separated layer 33 by ion implantation is, for example, $1 \times 10^{13}$ to $1 \times 10^{15}$ cm$^2$.

Figure 19B:
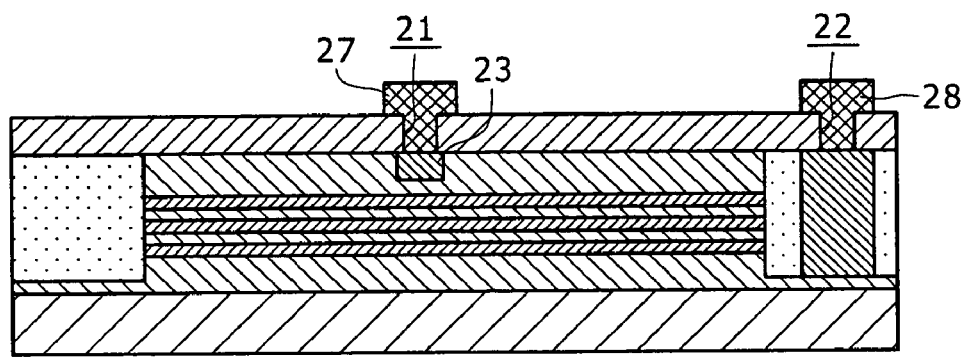

Next, as shown in FIG. 19B, a photoresist film (not shown) provided with openings on the regions for forming a gate electrode and a voltage applying electrode on the openings 21 and 22 is formed by an ordinary lithographic technology, and, thereafter, a conductive film for forming electrodes at the opening and the openings 21 and 22 is formed, for example by vapor deposition or sputtering, so as to fill up the openings. As the conductive film, for example, a metal laminate film composed of titanium (Ti), platinum (Pt), and gold (Au) in this order from the lower side is used. Thereafter, a lift-off treatment is carried out, to form the gate electrode 27 on the first conduction type diffusion layer 23 from the metal laminate film. In this instance, a surface voltage applying electrode 28 is also formed simultaneously. The electrode 28 is so formed as to be joined to the device-separated layer 33. The shape of the electrode 28 may be an L shape, a roughly angular U shape, a rectilinear shape or the like, as has been described above.

Figure 19C:
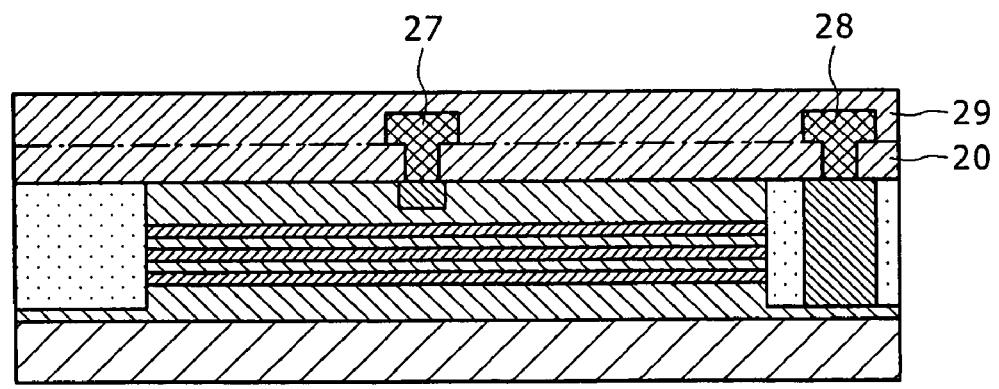

Subsequently, as shown in FIG. 19C, an insulation film 29 is further formed on the surface of the insulation film 20, to protect the gate electrode 27 and the electrode 28. The insulation film 29 is formed by forming a silicon nitride film, for example.

Figure 19D:
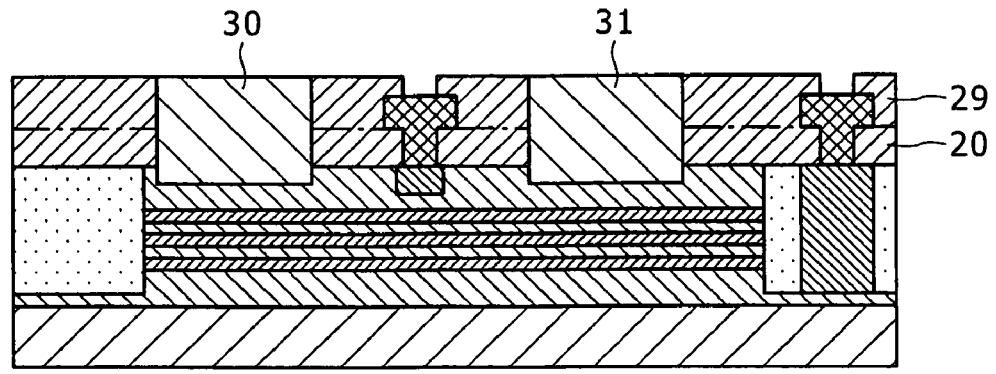

Next, as shown in FIG. 19D, a photoresist mask provided with openings in regions for forming drain and source electrodes is formed by an ordinary lithographic technology, and the insulation films 29 and 20 are removed by etching. Then, a conductive film to be the drain and source electrodes is deposited so as to fill up the removed portions, by vapor deposition or sputtering. As the conductive film, for example, a laminate film composed of a nickel (Ni) layer, a germanium (Ge) layer, and a gold (Au) layer in this order from the lower side is used. Thereafter, a lift-off treatment is conducted, to thereby form the drain electrode 30 and the source electrode 31 from the laminate film.

Subsequently, in the same manner as described referring to FIG. 18C, predetermined wirings are connected to the drain electrode 30, the source electrode 31, the gate electrode 27, and the voltage applying electrode 28 so that a positive voltage will be applied to the electrode 28 from a positive power supply (not shown).

Also, in the second embodiment of the method of manufacturing a semiconductor layer, like in the first embodiment, the electrode 28 to which the positive voltage is to be applied is formed in the device separation region 25 of the semiconductor substrate 10 comprising the semiconductor layer (ranging from the buffer layer 12 to the barrier layer 18) laminated while including the semiconductor layer (the electron supply layer 13, the spacer layer 14, the electron transit layer 15, the spacer layer 16, and the electron supply layer 17) having the heterojunction on the semiconductor substrate (the semi-insulating GaAs substrate 11), specifically on the surface of at least a part of the device separation region 25 in the periphery of the field effect transistor 2. Therefore, when the field effect transistor 2 formed is used as an RF switch, the OFF-time capacity can be reduced, whereby the intermodulation distortion can also be reduced, so that it is possible to manufacture an RF switch showing low distortion and low loss. Further, with the electrode 28 formed on the device-separated layer 33 by implantation of an ion in a higher concentration than that in the device separation region 25, the OFF capacity reducing effect is further enhanced, and it is possible to provide an RF switch showing a lower distortion and a lower loss.

Embodiment 7

Now, a third embodiment of the method of manufacturing a semiconductor device will be described below referring to manufacturing step sectional diagrams shown in FIGS. 20A to 21C. FIGS. 20A to 21C illustrate the method of manufacturing a semiconductor device according to the third embodiment of the semiconductor device as above-described.

Figure 20A:
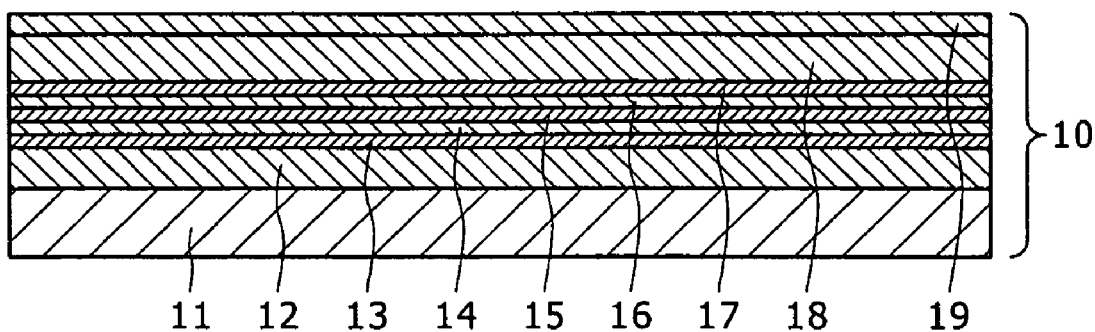
FIGS. 20A to 20C show manufacturing step sectional diagrams illustrating a third embodiment of the method of manufacturing a semiconductor device according to the present invention.

As shown in FIG. 20A, a semiconductor substrate 10 is formed as follows. For example, a buffer layer 12, an electron supply layer 13, a spacer layer 14, an electron transit layer 15, a spacer layer 16, an electron supply layer 17, a barrier layer 18, and a high cocentration layer 19 are sequentially formed on a semi-insulating GaAs substrate 11. Each of the layers is formed, for example, by an epitaxial growth method, as follows. The buffer layer 12 is formed, for example, of a non-doped AlGaAs layer. The electron supply layer 13 is composed, for example, of an n+ AlGaAs layer. The spacer layer 14 is formed, for example, of a non-doped AlGaAs layer. The electron transit layer 15 is composed, for example, of a non-doped InGaAs layer. The spacer layer 16 is formed, for example, of a non-doped AlGaAs layer. The electron supply layer 17 is composed, for example, of an n+ AlGaAs layer. The barrier layer 18 is formed, for example, of an nAlGaAs layer. The high concentration layer 19 is composed, for example, of an n+ GaAs layer doped in n type. In this manner, the semiconductor substrate 10 is configured.

Figure 20B:
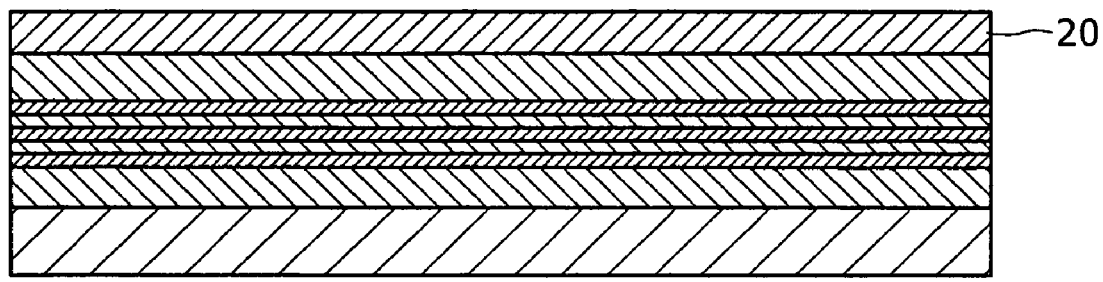

Next, as shown in FIG. 20B, by an etching technique using an ordinary photoresist (not shown) as a mask, the high concentration layer 19 in predetermined regions which become unnecessary in the course of formation of a field effect transistor is removed, and thereafter the photoresist is removed.

Subsequently, an insulation film 20 is formed. The insulation film 20 is formed, for example, by forming a silicon nitride film in a thickness of about 300 nm.

Figure 20C:
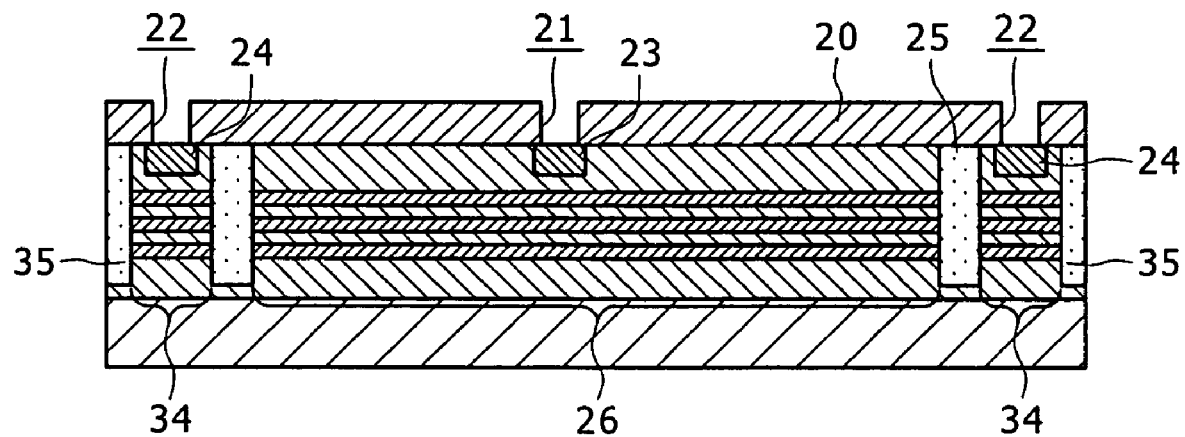

Next, as shown in FIG. 20C, the insulation film 20 in a predetermined region to be a gate region of the field effect transistor and in a region for disposing an electrode for applying a substrate voltage is removed, to form openings 21 and 22. Thereafter, selective diffusion of zinc (Zn) is conducted via the openings 21 and 22 by using the insulation film 20 as a mask, to form first conduction type (p-type) diffusion layers 23 and 24.

Thereafter, by an ion implantation technique using an ordinary photoresist as a mask (not shown), an impurity (e.g., boron) ion is implanted into the region for forming a device separation region, to form an electrical device separation region 25. Simultaneously, a device separation region 23 is formed so that an active region 34 similar to an active region 26 surrounded by the device separation region 25 is formed on the outside of the device separation region 25. Therefore, the device separation region 25, the active region 34, and the device separation region 35 are sequentially disposed on the outside of the active region 26. Besides, the diffusion layer 24 is formed on the surface of the active region 34.

Figure 21A:
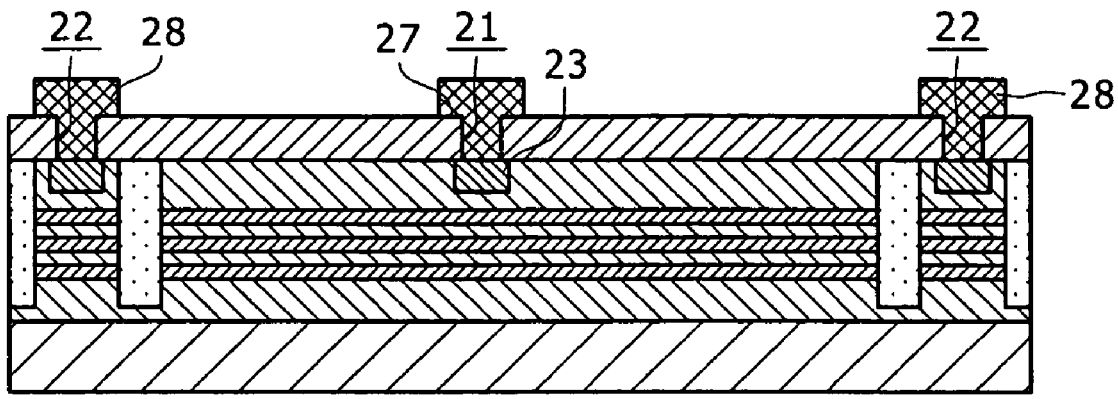
FIGS. 21A to 21C show manufacturing step sectional diagrams illustrating the third embodiment of the method of manufacturing a semiconductor device according to the present invention.

Next, as shown in FIG. 21A, a photoresist film (not shown) provided with openings on the regions for forming a gate electrode and a voltage applying electrode on the openings 21 and 22 is formed by an ordinary lithographic technology, and, thereafter, a conductive film for forming electrodes at the opening and the openings 21 and 22 is formed so as to fill up the openings, by vapor deposition or sputtering, for example. As the conductive film, for example, a metal laminate film composed of titanium (Ti), platinum (Pt), and gold (Au) in this order from the lower side is used. Thereafter, a lift-off treatment is carried out, whereby the gate electrode 27 is formed on the first conduction type diffusion layer 23 from the metal laminate film. In this instance, the surface voltage applying electrode 28 to be joined to the diffusion layer 24 is also formed simultaneously.

Figure 21B:
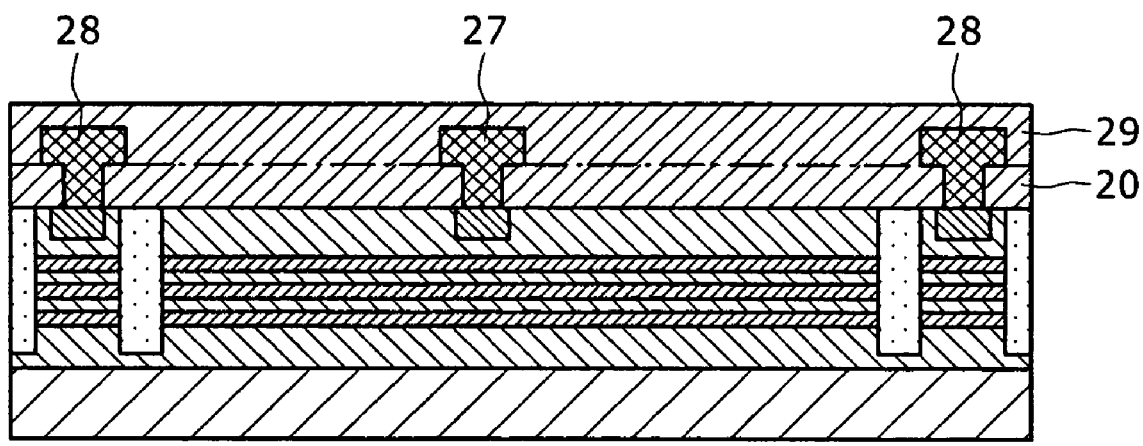

Subsequently, as shown in FIG. 21B, an insulation film 29 is further formed on the surface of the insulation film 20, to protect the gate electrode 27 and the electrode 28. The insulation film 29 is formed by forming a silicon nitride film, for example.

Figure 21C:
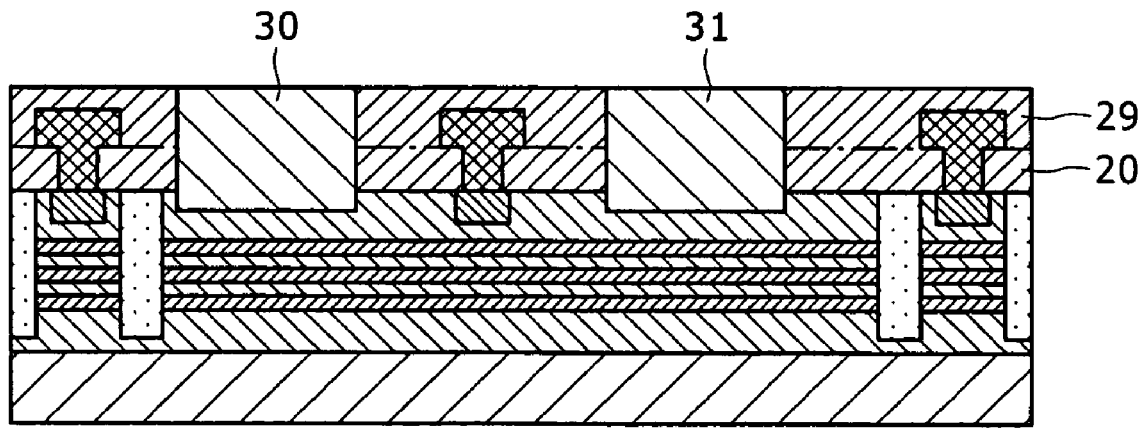

Next, as shown in FIG. 21C, a photoresist mask provided with openings in regions for forming drain and source electrodes is formed by an ordinary lithographic technology, and the insulation films 29 and 20 are removed by etching. Then, a conductive film to be the drain and source electrodes is deposited so as to fill up the removed portions, by vapor deposition or sputtering. As the conductive film, for example, a laminate film composed of a nickel layer (Ni), a germanium (Ge) layer, and a gold (Au) layer in this order from the lower side is used. Thereafter, a lift-off treatment is carried out, whereby the drain electrode 30 and the source electrode 31 are formed from the laminate film.

Subsequently, as shown in FIG. 12 above, predetermined wirings are connected to the drain electrode 30, the source electrode 31, the gate electrode 27, and the voltage applying electrode 28 so that a positive voltage will be applied from a positive power supply (not shown) to the electrode 28.

Embodiment 8

Figure 22:
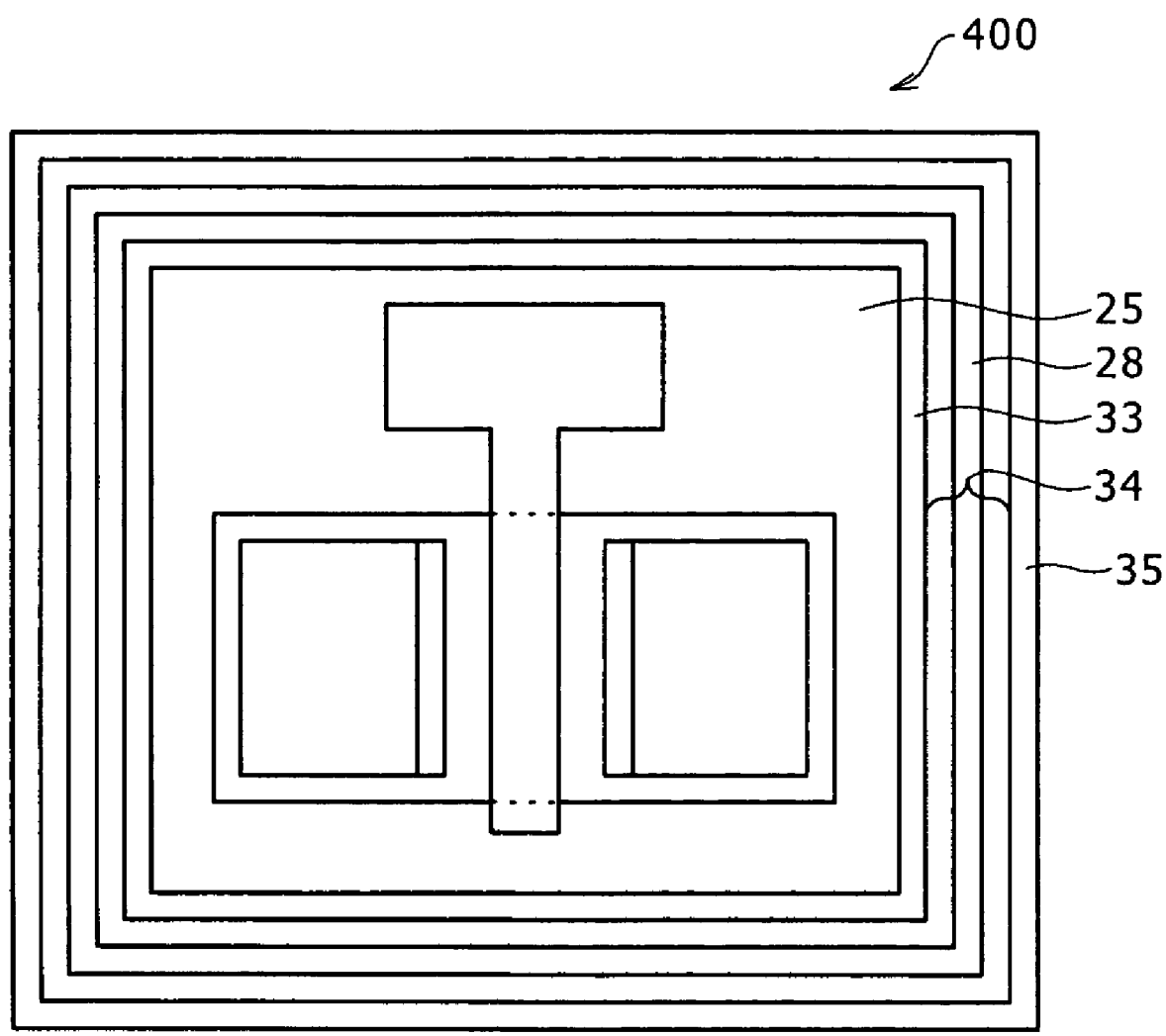
FIG. 22 is a plan layout diagram showing a fourth embodiment of the method of manufacturing a semiconductor device according to the present invention.

A fourth embodiment of the method of manufacturing a semiconductor device will be described referring to a plan layout diagram shown in FIG. 22. FIG. 22 illustrates the method of manufacturing a semiconductor device according to the fourth embodiment of the semiconductor device as above-described.

The fourth embodiment is characterized in that, for example, after the device separation regions 25 and 35 are formed in the third embodiment above, a layer 33 device separated by implantation of an ion in a higher concentration than that in the device separation region 25 is formed so as to avoid the area of the diffusion layer 24, between the device separation region 25 and the active region 34. The device-separated layer 33 can be formed by ion implantation using an ordinary resist mask. Where the dose in ion plantation for forming the device separation region 25 is, for example, $9 \times 10^{12}$ to $5 \times 10^{13}$ cm$^2$, the dose in ion implantation for forming the device-separated layer 33 is higher than the dose for the device separation region 25 and is in the range of $1 \times 10^{13}$ to $1 \times 10^{15}$ cm$^2$. The other steps are the same as in the third embodiment. As a result, the configuration of the above-mentioned semiconductor device 4 can be formed.

The film configuration of the heterojunction type field effect transistor described above is merely an example, and the configuration in which a positive voltage is applied to the substrate according to the present invention can be applied also to heterojunction type field effect transistors having other film configurations than the above-described, whereby it is possible to provide RF switches showing low distortion and low loss.

The semiconductor device and the method of manufacturing a semiconductor device according to embodiments of the present invention are applicable to the use as switching devices, particularly for high-frequency signals, in communication system apparatuses and the like.

It should be understood by those skilled in the art that various modifications, combinations, sub-combinations and alterations may occur depending on design requirements and other factors insofar as they are within the scope of the appended claims or the equivalents thereof.

The invention is claimed as follows:

1. A semiconductor device comprising:
   a device formation region;
   a substrate including a field effect transistor, the field effect transistor including a heterojunction, a gate electrode, a source electrode, and a drain electrode, said field effect transistor formed in the device formation region;
   a device separation region formed on a semiconductor substrate and spaced apart from the source electrode and drain electrode, wherein said device separation region includes a layer with a conductive impurity introduced therein, wherein the device separation region electrically isolates the device formation region upon which the field effect transistor is formed; and
   a substrate voltage applying electrode formed on a surface of at least a part of said device separation region and continuously surrounding a plurality of sides of said field effect transistor, the substrate voltage applying electrode spaced apart from and electrically separated from the source electrode and the drain electrode.

2. The semiconductor device as set forth in claim 1, wherein a layer device separated by implantation of an ion in a concentration higher than that in the device separation region is formed in the part of the device separation region where said electrode is formed.

3. The semiconductor device as set forth in claim 1, including an active region formed in the part of the device separation region where said substrate voltage applying electrode is formed.

4. The semiconductor device as set forth in claim 3, wherein the layer device is formed between said device formation region and said active region.

5. The semiconductor device as set forth in claim 1, further comprising a power supply, wherein the field effect transistor includes a drain terminal, and wherein said substrate voltage applying electrode is connected to the power supply or to the drain terminal of the field effect transistor.

6. The semiconductor device as set forth in claim 1, wherein the substrate voltage applying electrode is formed on the device separation region in an L shape and continuously surrounds two of the sides of the field effect transistor.

7. The semiconductor device as set forth in claim 1, wherein the heterojunction includes a first electron supply layer, a first spacer layer formed on the first electron supply layer, an electron transit layer formed on the first spacer layer, a second spacer layer formed on the electronic transit layer, and a second electron supply layer formed on the second spacer layer.

8. The semiconductor device as set forth in claim 1, further comprising an insulation layer that is formed between the substrate voltage applying electrode, and the drain and source electrodes of the field effect transistor.

9. The semiconductor device as set forth in claim 7, wherein the first electron supply layer is formed of an n$^+$ AlGaAs layer, the electron transit layer is formed of a non-doped InGaAs layer, and the second electron supply layer is formed of an n$^+$ AlGaAs layer.

10. The semiconductor device as set forth in claim 7, wherein the device separation region extends from at least the first electron supply layer to the second electron supply layer.

11. The semiconductor device as set forth in claim 1, wherein the electrode to which the positive voltage can be applied surrounds the entire periphery of the field effect transistor.

12. The semiconductor device as set forth in claim 1, wherein the substrate voltage applying electrode is asymmetrical with respect to the field effect transistor when viewed on a plan layout basis.

13. The semiconductor device as set forth in claim 1, wherein the device separation region is formed by ion implantation of boron.

14. The semiconductor device as set forth in claim 1, wherein the conductive impurity of the layer of the device separation region is zinc.

* * * * *